(12) United States Patent
Morisue et al.

(10) Patent No.: US 7,732,334 B2
(45) Date of Patent: Jun. 8, 2010

(54) METHOD FOR MANUFACTURING SEMICONDUCTOR DEVICE

(75) Inventors: Masafumi Morisue, Kanagawa (JP); Gen Fujii, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 11/195,725

(22) Filed: Aug. 3, 2005

(65) Prior Publication Data
US 2006/0040435 A1 Feb. 23, 2006

(30) Foreign Application Priority Data
Aug. 23, 2004 (JP) ............................. 2004-241805

(51) Int. Cl.
*H01L 21/311* (2006.01)
(52) U.S. Cl. ...................... 438/694; 438/629; 438/646; 438/687; 438/689; 438/712; 438/148; 430/322; 430/312; 430/323; 430/324; 257/62; 257/762
(58) Field of Classification Search ................ 438/689; 430/322; 257/62
See application file for complete search history.

(56) References Cited

U.S. PATENT DOCUMENTS

| | | | |
|---|---|---|---|
| 6,303,277 B1 * | 10/2001 | Hieda et al. ................. | 430/322 |
| 6,734,029 B2 | 5/2004 | Furusawa | |
| 6,812,136 B2 * | 11/2004 | Koyama et al. ............. | 438/629 |
| 6,838,361 B2 | 1/2005 | Takeo | |
| 6,847,069 B2 * | 1/2005 | Park et al. ................... | 257/288 |
| 2002/0151161 A1 | 10/2002 | Furusawa | |
| 2003/0143845 A1 * | 7/2003 | Mori et al. .................. | 438/689 |
| 2004/0005742 A1 * | 1/2004 | Ohtani et al. ............... | 438/151 |

FOREIGN PATENT DOCUMENTS

| | | |
|---|---|---|
| CN | 1462484 | 12/2003 |
| JP | 2000-39213 | 2/2000 |
| JP | 2000-89213 | 3/2000 |
| JP | 2002-164635 | 6/2002 |
| WO | WO 02/073712 A1 | 9/2002 |

OTHER PUBLICATIONS

Office Action, (Application No. 200510091142.4; CN08101), dated Aug. 14, 2009 with English Translation.

* cited by examiner

*Primary Examiner*—Nadine Norton
*Assistant Examiner*—Maki Angadi
(74) *Attorney, Agent, or Firm*—Nixon Peabody LLP; Jeffrey L. Costellia

(57) ABSTRACT

It is an object of the present invention to provide a method for manufacturing a substrate having film patterns such as an insulating film, a semiconductor film, and a conductive film in simple processes. It is another object of the invention to provide a method for manufacturing a semiconductor device with high throughput and high yield at low cost. A method for manufacturing a semiconductor device including the steps of: forming a first film over a substrate; discharging a solution containing a mask material to the first film thereby forming a mask over the first film; patterning the first film with the use of the mask thereby forming low wettability regions and a high wettability region over the substrate; removing the mask; and discharging a solution containing a material of an insulating film, a semiconductor film, or a conductive film to the high wettability region provided between the low wettability regions thereby forming a pattern of the insulating film, the semiconductor film, or the conductive film.

24 Claims, 26 Drawing Sheets

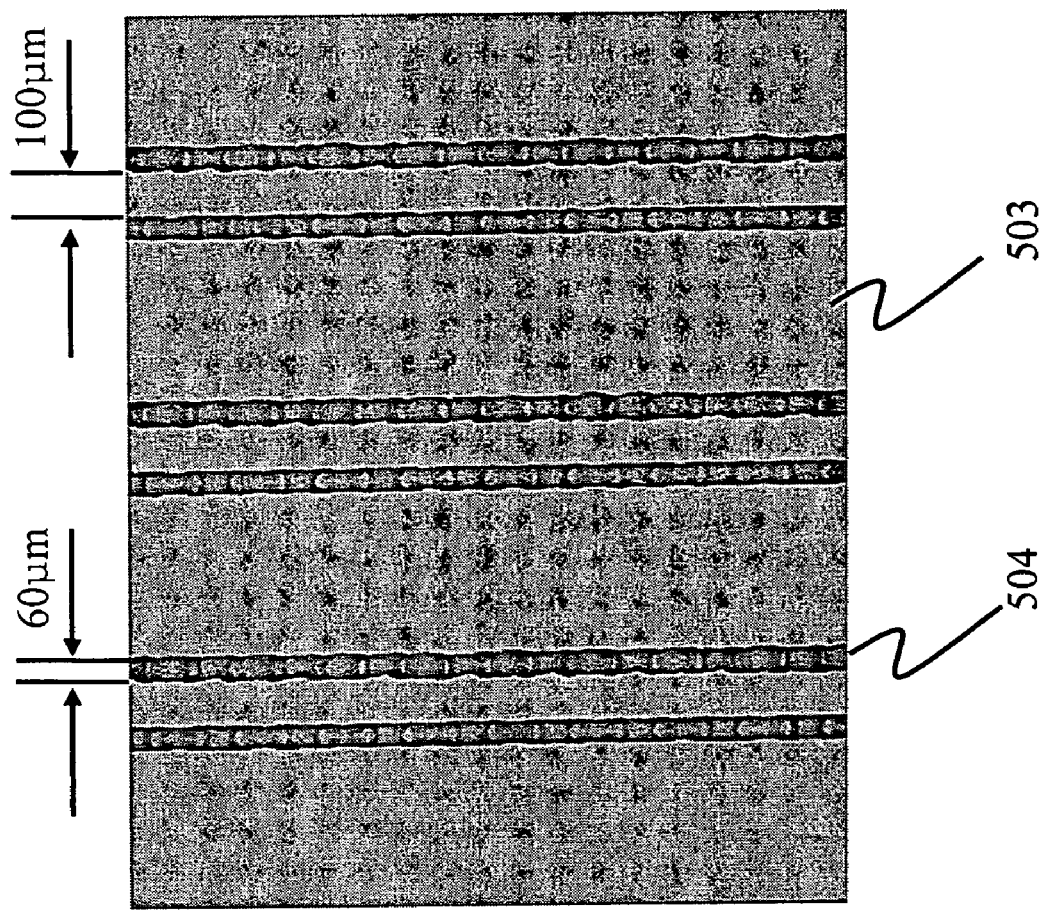

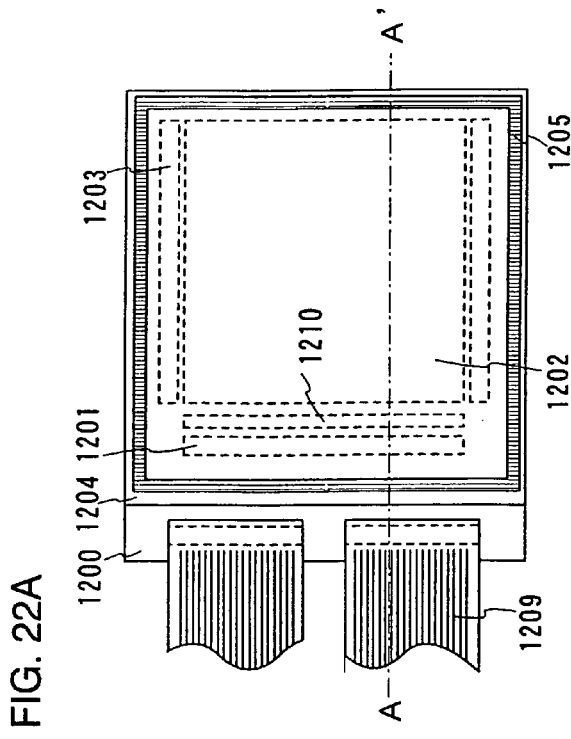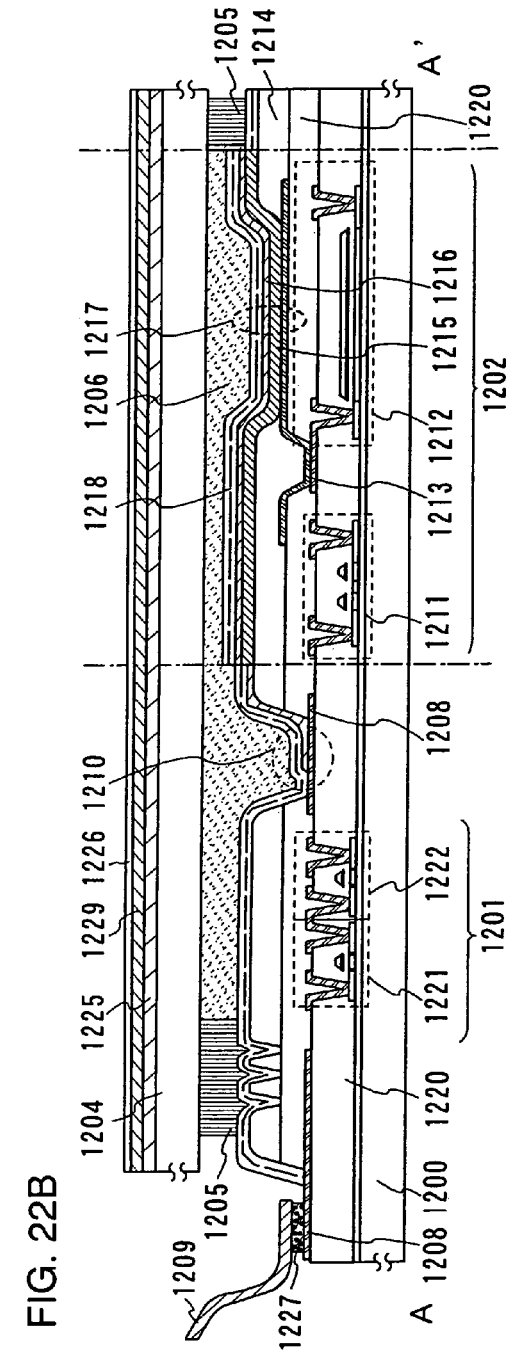

METHOD FOR MANUFACTURING SEMICONDUCTOR DEVICE

BACKGROUND OF THE INVENTION

1. Field of the Invention

The present invention relates to a method for manufacturing a semiconductor device having a semiconductor element formed by a droplet discharge method represented by an ink-jet method. The invention further relates to techniques for forming films of various parts of a semiconductor element, mask patterns, and contact holes.

2. Description of the Related Art

As to manufacturing of semiconductor devices, a droplet discharge systems are considered to be used for forming a pattern of a thin film or a wiring of a semiconductor element for the purpose of reducing facility cost, and simplifying a process.

There has been a problem that a solution discharged by a droplet discharge method is spread. Further, the spread on a substrate tends to be nonuniform. In the case of forming a wiring by discharging a solution containing metal particles by a droplet discharge method, problems such as shorting between wirings are caused. Accordingly, when the space between wirings is narrow, a method in which a pattern of a low wettable material is formed to repel the wirings thereby preventing the wirings from shorting to each other, is used.

As a method for forming such a pattern, a method in which an organic material film containing a fluoroalkyl group is formed and thereafter subjected to UV irradiation using a photomask pattern used in a normal photolithography process, or the like has been employed (for example, reference 1: Japanese Patent Laid-Open No. 2002-164635).

However as to the above method, since a photomask used in a normal photolithography process is used, reduction in facility cost and simplification in processes cannot be achieved.

BRIEF SUMMARY OF THE INVENTION

The present invention has been made in view of the above problems and it is an object of the present invention to provide a method for manufacturing a substrate having film patterns such as an insulating film, a semiconductor film, and a conductive film in simple processes. It is another object of the invention to provide a method for manufacturing a semiconductor device with high throughput and high yield at low cost.

It is a feature of the invention that regions having different wettabilities are formed and a pattern of an insulating film, a semiconductor film, or a conductive film is formed by using the regions, namely, by using the wettability difference without carrying out a normal photolithography process (resist formation, exposure and development with the use of a photomask).

One mode of the present invention includes the steps of: forming a first film over a substrate; discharging a solution containing a mask material to the first film thereby forming a mask over the first film; patterning the first film with the use of the mask thereby forming low wettability regions and a high wettability region over the substrate; removing the mask; and discharging a solution containing a material of an insulating film, a semiconductor film, or a conductive film to the high wettability region provided between the low wettability regions thereby forming a pattern of the insulating film, the semiconductor film, or the conductive film.

One mode of the present invention includes the steps of: forming a first film on an insulating film, a semiconductor film, or a conductive film formed over a substrate; discharging a solution containing a first mask material to the first film thereby forming a first mask over the first film; patterning the first film with the use of the first mask thereby forming low wettability regions and a high wettability region over the surface of the insulating film, the semiconductor film, or the conductive film; removing the first mask; discharging a solution containing a second mask material to the high wettability region provided between the low wettability regions thereby forming a second mask; and etching with the use of the second mask the first film and the insulating film, the semiconductor film, or the conductive film which are patterned.

A material of the first film will be described below; a compound having a fluorocarbon chain is typically used. As a method for forming the first film, the substrate may be coated with a solution in which the material of the first film is diluted. Alternatively, the substrate and the solution in which the material of the first film is diluted may be put in one closed container, so that the vapor of the material is adsorbed into the substrate.

A surfactant may be added to the solution containing a mask material. Thus, the surface tension of the solution can be reduced, and a mask (the first mask) can be formed without causing problems such as disconnection.

The mask (the first mask) is formed by a liquid phase method or a printing method using a solution containing a mask material. The liquid phase method representatively includes a droplet discharge method, an ink-jet method, a spin coating method, a roll coating method, a slot coating method and the like.

The material of the insulating film, semiconductor film, or conductive material, and the material of the second mask are formed by the liquid phase method using a solution comprising each material. The liquid phase method includes a droplet discharge method, an ink-jet method, a spin coating method, a roll coating method, a slot coating method, and the like representatively.

Contact angle of a liquid is large in low wettability regions, and contact angle of the liquid is small in the high wettability region. It is preferable that difference between contact angles of the low wettability regions and the high wettability region be 30°, or desirably 40° or more. In the case where a solution is applied or discharged to two regions of different contact angle as above, the solution spreads over the surface of the high wettability region and is repelled in a hemispherical shape at the interface of the low wettability regions. Thus, each mask pattern can be formed in a self-aligned manner.

Accordingly, the contact angles of a solution containing a material of an insulating film, a semiconductor film, or a conductive film and a solution containing a material of the second mask are desirably larger than the contact angle of the solution containing a material of an insulating film, a semiconductor film, or a conductive film in the high wettability region. Further, difference between the contact angles of the low wettability regions and the high wettability region is desirably 30° or more.

The solution containing a material of an insulating film, a semiconductor film, or a conductive film, or a material of the second mask may preferably be repelled by the first film. Meanwhile, the solution containing a material of the mask (the first mask) is required not to cause disconnection or the like. Therefore, the contact angle of the solution containing a material of the mask (the first mask) on the first film may preferably be smaller than the contact angle of the solution containing a material of an insulating, a semiconductor film, or a conductive film, or a material of the second mask.

The first film which remains may be thoroughly removed after forming the insulating film, semiconductor film, or conductive film, and the second mask.

In addition, a pattern can be formed by etching an insulating film, a semiconductor film, or a conductive film provided over a substrate with the use of the second mask formed as above.

A pattern having a width of 1 μm to 500 μm is formed as a film pattern; however, a thin line pattern having 1 μm or less can also be formed without limitation thereto.

According to the invention, an insulating film, a semiconductor film, or a conductive film, having a desired shape, and an insulating film in which a contact hole is formed can be formed. Specifically, an insulating film such as a gate insulating film, an interlayer insulating film, a protective film, an insulating film in which a contact hole is formed, a semiconductor film such as a channel region, a source region, a drain region, and a conductive film such as a source electrode, a drain electrode, a wiring, a gate electrode, a pixel electrode, and an antenna can be formed.

A semiconductor element includes a TFT, a field effect transistor (FET), a MOS transistor, a bipolar transistor, an organic semiconductor transistor, a MIM element, a memory element, a diode, a photoelectric conversion element, a capacitor, a resistor, and the like.

A semiconductor device is, for example, an integrated circuit, a display device, a wireless tag, an IC tag, an IC card, or the like formed of a semiconductor element. The display device is, for example, a liquid crystal display device, a light emitting display device, a DMD (Digital Micromirror Device), a PDP (Plasma Display Panel), an FED (Field Emission Display), an electrophoresis display device (electronic paper), or the like. The TFT is, for example, a staggered TFT, an inverted staggered TFT (a channel-etch type TFT or a channel protective type TFT), or a coplanar top-gate TFT, a coplanar bottom-gate TFT, or the like.

The display device designates a device using a display element, namely, an image display device. Further, a module in which a connector such as a flexible printed circuit (FPC) or a TAB (Tape Automated Bonding) tape, or a TCP (Tape Carrier Package) is attached to a display panel, a module in which a printed circuit board is provided at an end of a TCP or a TAB tape, and a module in which an IC (Integrated Circuit) and a CPU are directly mounted on a display element by a COG (Chip On Glass) method are all included in the display device.

According to the invention, a film pattern having a desired shape can be formed on a desired position. A film which functions as an interlayer insulating film, a planarizing film, a gate insulating film, or the like can be formed selectively on a desired position. Moreover, a film pattern and an insulating film having a contact hole can be formed without being subjected to exposure and development processes and the like using a resist mask pattern or a photomask pattern. Accordingly, the manufacturing process can be considerably simplified as compared to conventional techniques. Further, a film pattern can be formed to have an arbitrary shape in an arbitrary position.

As described above, according to the invention, a semiconductor element and a semiconductor device can be formed with good precision in a simple process without carrying out exposure and development processes and the like using a resist mask pattern or a photomask pattern. Further, a method for manufacturing a semiconductor element or a semiconductor device with high throughput and yield at low cost can be provided.

Since plasma treatment is not carried out, damage is not caused if a base film is a silicon film, a silicon oxide film, or a silicon nitride film, for example.

A droplet discharge method is used for forming a mask, a conductive film, or the like. Thus, droplets can be discharged onto an arbitrary position by changing relative locations of a substrate and a nozzle which is an discharging opening of the droplets containing a material of the films. Further, the thickness and the width of a pattern to be formed can be controlled in accordance with the relative relationship between the nozzle diameter, the amount of the droplets to be discharged, and the movement speed of the nozzle and a substrate on which the discharged droplets are applied, so that the films can be formed with high accuracy in a desired portion.

BRIEF DESCRIPTION OF THE DRAWING

FIG. 6 is a figure showing a manufacturing steps of a semiconductor device concerning the according to the present invention.

FIGS. 22A and 22B are figures showing structure of a light emission display module according to the present invention.

DETAILED DESCRIPTION OF THE INVENTION

Embodiment modes and embodiments according to the present invention will be described hereinafter with reference to the accompanying drawings. The present invention can be carried out in many different modes, and it is easily understood by those skilled in the art that modes and details herein disclosed can be modified in various ways without departing from the spirit and the scope of the present invention. Accordingly, the present invention should not be interpreted as limited to the description of the embodiment modes and embodiments given below.

Embodiment Mode 1

In this embodiment mode, a first film formed over a substrate is patterned to form a film pattern having a desired shape. The steps for forming the film pattern are shown in FIG. 1.

Figure 1A:
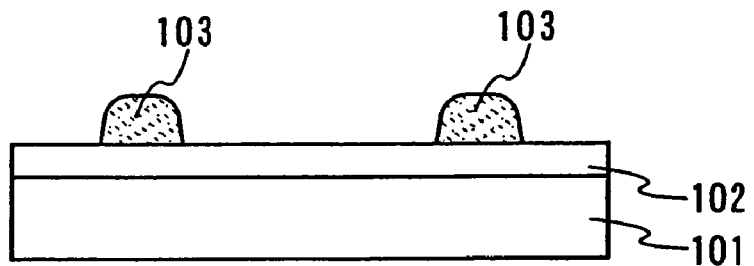
FIGS. 1A to 1D are cross-sectional views showing steps for forming a film pattern according to the present invention.
Figure 1B:
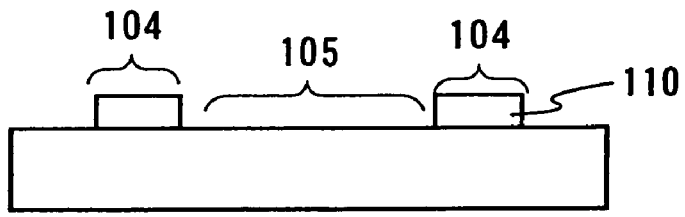

As shown in FIG. 1A, a first film 102 is formed over a substrate 101.

As the substrate 101, a glass substrate, a quartz substrate, a substrate formed of an insulating material such as alumina, a plastic substrate which is heat resistant to the processing temperature of a subsequent step, a silicon wafer, a metal substrate, or the like can be used. In this case, silicon oxide ($SiO_x$), silicon nitride ($SiN_x$), silicon oxynitride ($SiO_xN_y$) (x>y), silicon nitride oxide ($SiN_xO_y$) (x>y), or the like may be used to form an insulating film for preventing impurities and the like from dispersing from a substrate side. A substrate in which an insulating film such as of silicon oxide or silicon nitride is formed on the surface of a metal such as stainless or a semiconductor substrate can also be used. Further, a substrate having a size of 320×400 mm, 370×470 mm, 550×650 mm, 600×720 mm, 680×880 mm, 1000×1200 mm, 1100×1250 mm, or 1150×1300 mm can be used as the substrate 101. Here, a glass substrate is used as the substrate 101.

In the case of using a plastic substrate for the substrate 101, PC (polycarbonate), PES (polyethylene sulfone), PET (polyethylene terephthalate), PEN (polyethylene naphthalate), or the like which has relatively high glass transition temperature is preferably used.

The first film 102 can be formed by applying or discharging a material for forming the first film. Further, the first film can be formed over a substrate when the material and the substrate are put in one closed container.

A compound having a fluorocarbon chain is typically used as the material for forming the first film. A composition of the compound having a fluorocarbon chain is, for example, a silane coupling agent expressed by a chemical formula Rn—Si—$X_{4-n}$ (n=1, 2, or 3). Here, R contains a relatively inert group such as an alkyl group. Further, X denotes halogen, methoxy group, ethoxy group, acetoxy group, hydroxyl group or the like.

A fluorine-based silane coupling agent (fluoroalkyl silane (FAS)) having a fluoroalkyl group for R is used as the silane coupling agent; thus, the wettability can be reduced. R of FAS has a structure that can be expressed as $(CF_3)$ $(CF_2)_x(CH_2)_y$, (x: an integer from 0 to 10, y: an integer from 0 to 4). In the case where a plurality of R or X bond to Si, all R or all X may be the same or different. Typically, fluoroalkylsilane (hereinafter referred to as FAS) such as heptadecafluoro tetrahydrodecyl triethoxysilane, heptadecafluoro tetrahydrodecyl trichlorosilane, tridecafluoro tetrahydrooctyl trichlorosilane, or triflouropropyl trimethoxysilane is typically used.

As an example of a composition material for forming the first film, a material having a fluorocarbon chain (fluorine-based resin) can be used. As fluorine-based resin, polytetrafluoroethylene (PTFE; polytetrafluoroethylene resin), perfluoroalkoxyalkane (PFA; tetrafluoroethylene perfluoroalkylvinylether copolymerization resin), perfluoroethylene propylene copolymer (PFEP; tetrafluoroethylene hexafluoropropylene copolymer resin), ethylene-tetrafluoroethylene copolymer (ETFE; tetrafluoroethylene-ethylene copolymer resin), polyvinylidene fluoride (PVDF; resin), polychlorotrifluoroethylene (PCTFE; polytrifluorochloroethylene resin), ethylene-chlorotrifluoroethylene copolymer (ECTFE; resin), polytetrafluoroethylene-perfluorodioxol copolymer (TFE/PDD), polyvinylfluoride (PVF; vinyl fluoride resin), or the like can be used.

A material without a fluorocarbon chain can also be used for the first film. For example, octadecyltrimethoxysilane or the like can be used as an organic silane.

As a solvent used for the material, hydrocarbon solvent such as n-pentane, n-hexane, n-heptane, n-octane, n-decane, dicyclopentane, benzene, toluene, xylene, durene, indene, tetrahydronaphthalene, decahydronaphthalene, or squalene; tetrahydrofuran; or the like is used.

The first film can be formed by forming a film without a fluorocarbon chain and treating the surface with fluorine plasma. Another plasma treatment can be performed by preparing an electrode having a dielectric and generating plasma so that the dielectric is exposed to the plasma using air, oxygen or nitrogen. In this case, the dielectric is not required to cover the whole surface of the electrode. As the dielectric, a fluorine-based resin can be used. In the case of using the fluorine-based resin, a $CF_2$ bond is formed on the surface of the first film; thus, the surface property is modulated and the same properties as the compound having a fluorocarbon chain can be obtained. As such a film, a material in which a water-soluble resin such as polyvinyl alcohol (PVA) is mixed with the solution of $H_2O$ or the like can be used. Moreover, the combination of PVA and another water-soluble resin can be used as well. Further, an organic resin such as acrylic resin, polyimide resin, melamine resin, polyester resin, polycarbonate resin, phenol resin, epoxy resin, polyacetal, polyether, polyurethane, polyamide (nylon), furan resin, diallyl phthalate resin, and a resist material can be used.

Next, a solution containing a mask material is discharged onto the first film 102 by a droplet discharge method.

A water-soluble resin such as polyvinyl alcohol (PVA) can be used as a mask material. Moreover, the combination of PVA and another water-soluble resin can be used as well.

Alternatively, an organic resin such as acrylic resin, polyimide resin, melamine resin, polyester resin, polycarbonate resin, phenol resin, epoxy resin, polyacetal, polyether, polyurethane, polyamide (nylon), furan resin, diallyl phthalate resin, or a resist material can be used. Further, a hot-melt ink can be used. The hot-melt ink mainly contains a thermoplastic polymer which is solid in room temperature; thus, a mask can be formed only by removing the solvent.

A surfactant may be added to the solution containing a mask material. Surface tension of the solution can be reduced by adding a surfactant. Accordingly, the solution can be applied without causing troubles such as disconnection over the first film 102.

A fluorine-based surfactant can be used as the surfactant. For example, a surfactant having a fluoroalkyl group can be used. Naturally, the material is not limited thereto.

As the solvent, a polar solvent such as water, alcohols, ethers, dimethylformamide, dimethylacetoamide, dimethylsulfoxide, N-methylpyrrolidone, hexamethylphosphamidon, chloroform, methylene chloride can be used.

A diameter of a nozzle used as a droplet discharge means is set 0.1 to 50 μm (preferably 0.6 to 26 μm) and the amount of the composition discharged from the nozzle is set 0.00001 to 50 pl (preferably 0.0001 to 10 pl). The discharge amount increases in proportion to the diameter of the nozzle. Moreover, it is preferable that the object to be processed and a discharge opening of the nozzle be as close to each other as possible in order to drop a droplet to a desired position, which is preferably set about 0.1 to 2 mm.

Viscosity of the composition used for a droplet discharge method is preferably 300 mPa·s or less for preventing drying and for smoothly discharging the composition from the discharge opening. Note that the viscosity, surface tension, and the like of the composition may be appropriately controlled according to solvent used and the application.

Alternatively, the solution can be discharged while heating the substrate. Accordingly, the solvent can be removed immediately after applying the solution; thus, a mask 103 can be formed.

The distance between the masks depends on the width of the film pattern to be formed. In this specification, a film pattern with a width of 1 to 500 μm is formed; however, the width is not limited thereto.

In the case where the solution is not removed, the solvent of the solution containing the mask material is dried to form the mask 103. Alternatively, the mask 103 may be formed by heating and baking as necessary.

Next, an island shape first film 110 is formed by removing a part of the first film 102 where the mask 103 is not formed. The part of the first film 102 is removed by ultraviolet irradiation, dry etching, or wet etching although the removing method depends on the constituent material.

The mask 103 is removed with the use of a peeling agent, ashing, or the like. Thus, a high wettability region 105 and low wettability regions 104 can be formed over the substrate.

A solution containing a material of an insulating film, a semiconductor film, and a conductive film is applied to a region over the high wettability region 105 between the low wettability regions.

Figure 15:
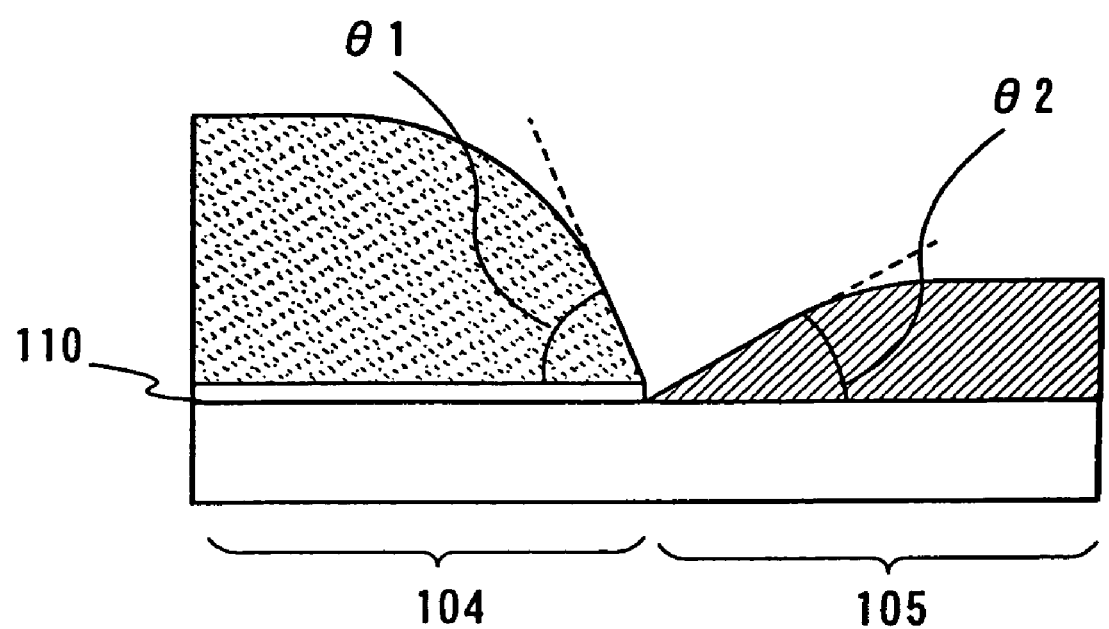
FIG. 15 is a figure showing a contact angle in low wettability regions and a high wettability region.

Here, relation between the low wettability regions 104 and the high wettability region 105 is described with reference to FIG. 15. The low wettability region is a region where a contact angle θ1 of liquid is large as shown in FIG. 15. On the surface, the liquid is repelled in a hemisphere shape. On the other hand, the high wettability region is a region where a contact angle θ2 of liquid is small. On the surface, the liquid is likely to spread.

Therefore, in the case where the two regions having different contact angles are in contact with each other, a region having a relatively smaller contact angle becomes a high wettability region while a region having a larger contact angle becomes a low wettability region. In the case of applying or discharging solution to the two regions having different contact angles, the solution spreads on the surface of the high wettability region while it is repelled in a hemisphere shape at the interface with the low wettability regions, and each mask pattern can be formed in a self-aligned manner.

It is preferable that difference between the contact angle θ1 of the low wettability region and the contact angle θ2 of the high wettability region be 30° or more, preferably 40° or more. As a result, a highly wettable material is repelled in a hemisphere shape on the surface of the low wettability region; thus, each mask pattern can be formed in a self-aligned manner. Accordingly, among the substances described as the materials and the methods for forming the first mask pattern, in the case where a difference between the contact angles is 30° or more, preferably 40° or more, the region formed of a material having a smaller contact angle becomes a high wettability region while the region formed of a material having a larger contact angle becomes a low wettability region. Similarly, as to a solution 106 containing a material of an insulating film, a semiconductor film, or a conductive film, which is to be described later, in the case where a difference between the contact angles is 30° or more, preferably 40° or more, the region formed of a material having a smaller contact angle becomes a high wettability region while the region formed of a material having a larger contact angle becomes a low wettability region.

Accordingly, a solution containing a material of an insulating film, a semiconductor film, or a conductive film, in the low wettability regions, desirably has larger contact angle than a solution containing a material of an insulating film, a semiconductor film, or a conductive film, in the high wettability region. Further, it is desirable that the difference between the contact angles of the low wettability region and the high wettability region be 30° or more.

The solution 106 containing a material of an insulating film, a semiconductor film, or a conductive film may preferably be repelled by the first film. Meanwhile, the solution containing a mask material is required not to cause disconnection or the like. Therefore, the contact angle of the solution containing a mask material on the first film may preferably be smaller than the contact angle of the solution containing a material of an insulating film, a semiconductor film, or a conductive film on the first film.

In the case where the surface has irregularities, it is difficult form a desired film pattern. However, the contact angle becomes larger in the region which has low wettability in the case where the surface has irregularities. Thus, the wettability is further reduced. In the region which has high wettability, on the other hand, the contact angle becomes smaller. Thus, the wettability is further increased. Accordingly, as the material which has low wettability and the material which has high wettability are applied or discharged to each surface having irregularities and baked, a desired pattern can be formed despite the irregularities.

As the material 106 discharged to the high wettability region, an insulating material, a conductive material, and a semiconductor material can be used appropriately. The insulating material is typically an organic resin such as acrylic resin, polyimide resin, melamine resin, polyester resin, polycarbonate resin, phenol resin, epoxy resin, polyacetal, polyether, polyurethane, polyamide (nylon), furan resin, or diallyl phthalate resin, or siloxane polymer, polysilazane, PSG (Phosphorus Silicate Glass), and BPSG (Boron Phosphorous Silicon Glass) can be used.

A polar solvent such as water, alcohols, ethers, dimethylformamide, dimethylacetoamide, dimethylsulfoxide, N-methylpyrrolidone, hexamethylphosphamidon, chloroform, or methylene chloride can be used.

Furthermore, a conductor dissolved or dispersed in an solvent can be used as a typical conductive material. As the conductor, metal such as Ag, Au, Cu, Ni, Pt, Pd, Ir, Rh, W, Al, Ta, Mo, Cd, Zn, Fe, Ti, Si, Ge, Zr, or Ba; fine particles of silver halide or dispersible nanoparticles can be used. Alternatively, ITO used for a transparent conductive film, ITO containing silicon oxide, organic indium, organotin, zinc oxide (ZnO), titanium nitride (TiN), and the like can be used.

As a typical example of the semiconductor material, an organic semiconductor material can be used. It is preferable that a π-electron conjugated organic material or high molecular weight material having a conjugated double bond as its backbone be used as the organic semiconductor material. Typically, a soluble organic material or high molecular weight material such as polythiophene, poly (3-alkylthiophene), polythiophene derivative, and pentacene can be used.

The solution containing the material can be applied by a droplet discharge method, an ink-jet method, a spin coating method, a roll coating method, a slot coating method, or the like.

Figure 1C:
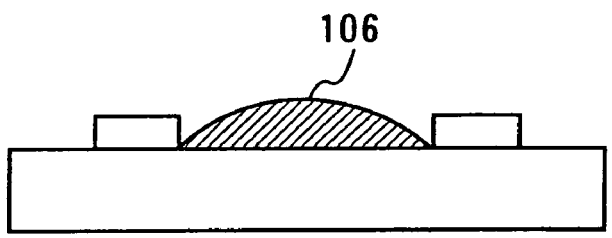
Figure 1D:
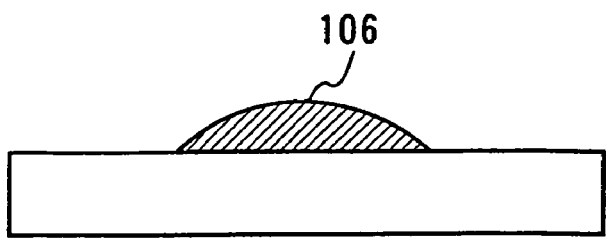

Next, after the solution containing the material that has high wettability is applied, drying and baking are carried out to form the desired film pattern 106 as shown in FIG. 1C. In the case where the material is an insulating material, the film pattern is formed as an insulating layer having a desired shape. In the case where the material is the conductive material, the film pattern is formed as a conductive layer having a desired shape. Further, in the case where the material is the semiconductor material, the film pattern is formed as a semiconductor layer having a desired shape. As shown in FIG. 1D, the first film may be removed subsequently.

Through the above steps, a film pattern having a desired shape can be formed without using a known photolithography process. Accordingly, the number of manufacturing steps can considerably be reduced.

Embodiment Mode 2

In this embodiment mode, a first film is patterned over an insulating film, a semiconductor film, or a conductive film. Steps of patterning the insulating film, semiconductor film, or conductive film to a desired shape using the pattern is shown in FIGS. 2A to 2E.

Figure 2A:
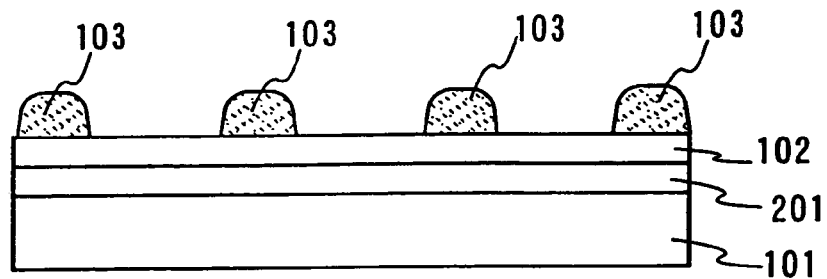
FIGS. 2A to 2E are cross-sectional views showing steps for forming a film pattern according to the present invention.

As shown in FIG. 2A, an insulating film, a semiconductor film, or a conductive film 201 is formed over a substrate 101.

The substrate 101 may be formed of a material shown in Embodiment Mode 1. Further, an insulating film of silicon oxide (SiOx), silicon nitride (SiNx), silicon oxynitride (SiOxNy) (x>y), silicon nitride oxide (SiNxOy) (x>y), or the like may be formed for preventing impurities and the like from diffusing from the substrate side.

The insulating film, semiconductor film, or conductive film 201 can be formed to a desired shape.

A film containing an oxide or a nitride of a semiconductor, such as a silicon oxide film, a silicon oxynitride film, a silicon nitride oxide film, a silicon nitride film; or an inorganic or organic insulator; or the like can be used for the insulating film 201. The insulating film can be formed by a known method such as CVD, sputtering, an application method, or vapor deposition.

A film of silicon, germanium, GaAs, an organic semiconductor, or the like can be used for the semiconductor film 201. The semiconductor film can be formed by a known method such as CVD, sputtering, an application method, and vapor deposition. Further, the semiconductor film may be amorphous or crystalline.

As the conductive film 201, a metal film, a transparent conductive film (indium tin oxide, indium tin oxide containing silicon oxide, IZO, or the like), or the like can be used.

Next, a first film 102 is formed over the insulating film, semiconductor film, or conductive film 201. The material, solvent, and formation method shown in Embodiment Mode 1 can be used for the first film.

Next, a solution containing a first mask material is discharged to the first film 102 by a droplet discharge method to form a first mask 103 as shown in FIG. 2A.

A material which is as described as the material containing a mask material in Embodiment Mode 1 can be used for the first mask material. Further, a surfactant may be added. Moreover, a solvent described in Embodiment Mode 1 can be also be used.

Figure 2B:
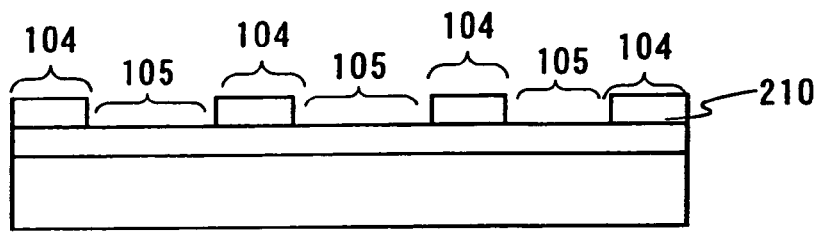

Next, a part of the first film 102 where the mask 103 is not formed is removed. The mask 103 is thereafter removed. Consequently, low wettability regions 105 and a high wettability region 104 are formed over the insulating film, semiconductor film, or conductive film 201(FIG. 2B).

Figure 2C:
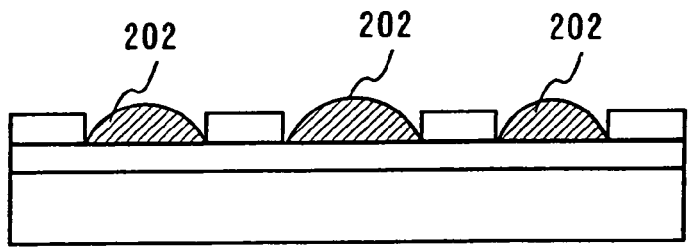

As shown in FIG. 2C, a solution containing a second mask material is applied to a region between low wettability regions over the high wettability region 105 and baked to form the second mask 202. As shown in FIG. 2C, a solution containing a material of the second mask is applied to a region where the first film 210 is not formed, namely, the high wettability region. As the method for applying, a droplet discharge method, an ink-jet method, a spin coating method, a roll coating method, a slot coating method, or the like can be used. As the material for the second mask, the mask material described in Embodiment Mode 1 can be used. The solvent described in Embodiment Mode 1 can be used.

As described in Embodiment Mode 1, a solution containing a second mask material, in the low wettability regions desirably has larger contact angle than a solution containing the second mask material, in the high wettability region. Further, it is desirable that the difference between the contact angles of the low wettability regions and the high wettability region be 30° or more. In this manner, a mask pattern can be formed in a self-aligned manner.

The solution containing the second mask material may preferably be repelled by the first film. Meanwhile, the solution containing the first mask material is required not to cause disconnection or the like. Therefore, the contact angle of the solution containing the first mask material on the first film may preferably be smaller than the contact angle of the solution containing the second mask material on the first film.

After that, drying and baking are carried out as necessary. Consequently, the second mask 202 as a mask pattern for etching can be formed.

Figure 2D:
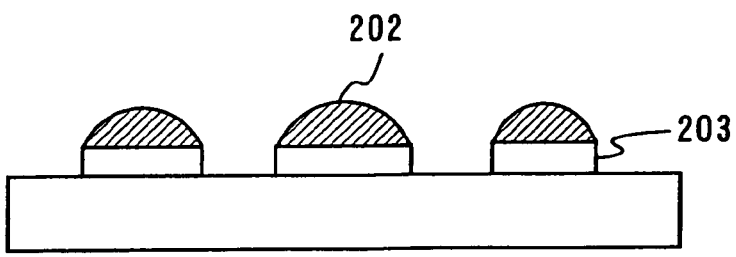

As shown in FIG. 2D, the first film 210 is removed using the second mask 202. In this embodiment mode, the first film 210 is removed by acing. After this, an exposed region of the insulating film, semiconductor film, or conductive film over the substrate is etched by a known method such as dry etching or wet etching, thereby forming the film pattern 203 having a desired shape can be formed. In the case where the second mask pattern has a columnar or cylindrical shape, the film pattern may be formed to have a contact hole.

Figure 2E:
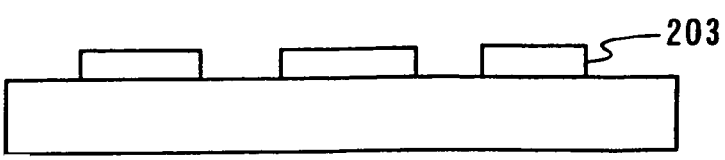

As shown in FIG. 2E, the film pattern 203 having a desired shape can be exposed by removing the second mask 202.

Through the above steps, a mask pattern having a desired shape can be formed by etching without using a known photolithography process. Accordingly, a film can be etched desired pattern through less number of steps than before. Further, a film pattern or a favorable contact hole can be formed through less number of steps than the conventional one.

Embodiment Mode 3

A manufacturing method of a semiconductor element will be described below. Note that a TFT is taken as an example of a semiconductor element in this embodiment mode; however, the invention is not limited to this. An organic semiconductor transistor, a diode, an MIM element, a memory element, a photoelectric converter, a capacitor, a resistor, or the like can be used.

In this embodiment mode, steps of manufacturing a channel-etch type TFT as a representative of an inverted staggered TFT as a semiconductor element are described according to the invention with reference to FIGS. 3A to 3D.

Figure 3A:
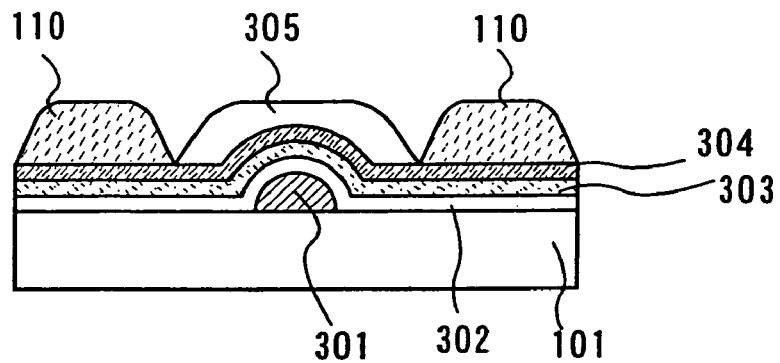
FIGS. 3A to 3D are cross-sectional views showing manufacturing steps of a semiconductor device according to the present invention.
Figure 3B:
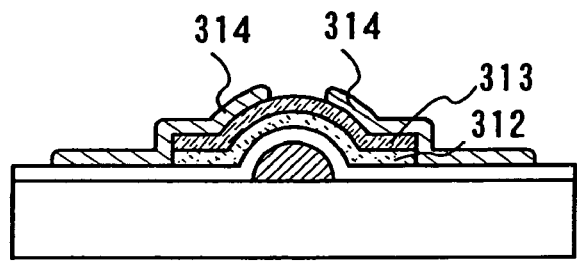

As shown in FIG. 3A, a gate electrode 301 is formed over a substrate 101. A silicon oxide film, a silicon nitride film, or the like is formed over the substrate as necessary. The gate electrode 301 is formed by a droplet discharge method, a printing method, electric field plating, PVD, and CVD. Here, the gate electrode is formed over the substrate 101 by the method shown in Embodiment Mode 1. In this case, the etching step using the mask pattern is not required, so that the manufacturing steps can be considerably simplified.

First, a first film is formed over a substrate, and a first mask is formed by discharging a solution containing a mask material to the first film by a droplet discharge method. Part of the first film where the first mask is not formed is removed by a method such as ultraviolet irradiation to form low wettability regions and a high wettability region. The first mask is removed thereafter. The solutions containing a material of the first film and the first mask shown in Embodiment Mode 1 and Embodiment Mode 2 may also be used in this embodiment mode.

Next, a solution containing a conductor described in Embodiment Mode 1 is dissolved or dispersed in a solvent is discharged to a high wettability region (where the first mask is not formed) between the low wettability regions (where the first mask having an island shape is formed) by a droplet discharge method. The first film forming the low wettability regions are thereafter removed. Thus, a gate electrode 301 can be formed.

It is preferable to use any one of gold, silver, and copper, which is dissolved or dispersed in a solvent for the composition discharged from the discharge opening in consideration of the resistivity. More preferably, silver or copper, which is low in resistance and cost, is used. In the case of using copper; however, a barrier film is preferably provided in combination to prevent impurities. An organic solvent of esters such as butyl acetate or ethyl acetate, alcohols such as isopropyl alcohol or ethyl alcohol, or an organic solvent such as methyl ethyl ketone, acetone, or the like may be used for the solvent.

As a barrier film used in the case of using copper for a wiring, an insulating or conductive substance containing nitrogen such as silicon nitride, silicon oxynitride, aluminum nitride, titanium nitride, or tantalum nitride (TaN) is preferably used. The aforementioned substances may be formed by a droplet discharge method as well.

Note that viscosity of the composition used for a droplet discharge method is preferably 5 to 20 mPa·s thereby preventing drying and smoothly discharging the composition from the discharge opening. It is preferable that the surface tension be 40 mN/m or less. Note that the viscosity, and the like of the composition may be appropriately controlled according to the solvent used and the application. As an example, the viscosity of the composition obtained by dissolving or dispersing indium tin oxide ( ), zinc oxide (ZnO), indium zinc oxide (IZO), gallium-doped zinc oxide (GZO), and indium tin oxide containing silicon oxide, or organotin in a solvent is 5 to 20 mPa·s, the viscosity of the composition obtained by dissolving or dispersing silver in solvent is 5 to 20 mPa·s, and the viscosity of the composition obtained by dissolving or dispersing gold in the solvent is 10 to 20 mPa·s.

It is preferable that the diameter of particles of conductors be as small as possible for preventing clogging of the nozzle and for forming a fine pattern, although it is dependent on the diameter of each nozzle, a desired pattern shape, and the like. Preferably, the diameter of the particle is 0.1 µm or less. The composition is formed by a known method such as an electrolyzing method, an atomizing method, and a wet reduction method. The particle size is generally about 0.5 to 10 µm. However, when the conductor is formed by gas evaporation method, a nanomolecule protected by a dispersion agent is as small as about 7 nm. When the surfaces of the nanoparticles are covered with a coating agent, the nanoparticles are dispersed stably at a room temperature without cohesion in the solvent, and it behaves in almost the same way as liquid. That is, the nanoparticles exhibit substantially the same behavior as that of liquid. Therefore, it is preferable to use a coating agent.

The step of discharging a composition may be carried out under reduced pressure. This is because subsequent steps of drying and baking can be omitted or shortened as the solvent of the discharged composition is volatilized until it reach the object to be processed. After discharging the solution, one or both steps of drying and baking are carried out by laser irradiation, rapid thermal annealing, using a heating furnace, or the like under atmospheric pressure or low pressure. The steps of drying and baking are both heat treatment although their purposes, temperatures, and time differ. Drying is carried out, for example, at 100° C. for 3 minutes and baking is carried out at 200 to 350° C. for 15 to 120 minutes. In order to carry out the steps of drying and baking favorably, a substrate may be heated, of which temperature is set at 100 to 800° C. (preferably, 200 to 350° C.), although it depends on a material of the substrate and the like. Through the steps, the solvent in the solution is volatilized or the dispersant is chemically removed, and the resin at the periphery is cured and shrunk, thereby fusing and welding are accelerated. This step is carried out in an oxygen atmosphere, a nitrogen atmosphere, or in the air. However, this step is preferably carried out in an oxygen atmosphere in which the solvent dissolved or dispersed with a metal element is easily removed.

Note that the conductive layer formed by a droplet discharge method is formed with fine particles that are conductors randomly overlapping in 3D. In other words, the conductive layer is formed of 3D cohesion particles. Accordingly, the surface thereof has small irregularities. Further, as the grain diameter of the particles increases when the fine particles are baked by the heat of the light absorption layer and the heat retention time thereof. Therefore, a layer having large irregularities is formed.

The laser irradiation may be conducted using a continuous wave or pulsed gas laser or a solid state laser. As the former gas laser, an excimer laser, a YAG laser, and the like are used while a laser using crystals such as YAG and $YVO_4$ doped with Cr, Nd, or the like is used as the latter solid-state laser. In view of the absorption rate of laser light, it is preferable to use a continuous wave laser. Further, what is called a hybrid laser irradiation method which is the combination of pulsed operation and continuous wave operation may also be used. However, depending on the heat resistance of the substrate, it is preferable to apply heat treatment by laser light irradiation instantaneously for several micro seconds to several tens seconds. The rapid thermal annealing (RTA) is performed in an inert gas atmosphere by instantaneously applying heat for several micro seconds to several minutes by raising temperature rapidly using an infrared lamp or a halogen lamp for emitting ultraviolet light to infrared light. This treatment is performed instantaneously; therefore, it is advantageous that only a thin film of the outermost surface can be substantially heated and a lower layer film is not affected.

Next, a gate insulating film 302 is formed over the gate electrode 301. The gate insulating film 302 is formed of a single layer or a layered structure of a silicon nitride film, a silicon oxide film, or another insulating film containing silicon by using a thin film forming method such as plasma CVD or sputtering. It is preferable that the gate insulating layer has a layered structure in the order of a silicon nitride film (a silicon nitride oxide film), a silicon oxide film, and a silicon nitride film (a silicon nitride oxide film) from a side in contact with the gate electrode layer. With this structure, since the gate electrode is in contact with the silicon nitride film, deterioration due to oxidization can be prevented.

Next, a first semiconductor film 303 is formed over the gate insulating film 302. As the first semiconductor film 303, a film having any one of an amorphous semiconductor, a semiamorphous semiconductor (also referred to as a SAS) in which an amorphous state and a crystalline state are mixed, a microcrystalline semiconductor in which crystal grains of 0.5 to 20 nm can be observed in an amorphous semiconductor, and a crystalline semiconductor is used. In particular, a microcrystalline state in which crystal grains of 0.5 to 20 nm can be observed is referred to as a microcrystal (μc). A film mainly containing silicon, silicon germanium (SiGe), or the like can be formed of a semiconductor film with a thickness of 10 to 60 nm.

SAS has an intermediate structure between an amorphous structure and a crystalline structure (including a single crystalline structure, and a polycrystalline structure), the semiamorphous semiconductor has a third state that is stable in terms of free energy, and includes a crystalline region having short range order and lattice distortion. Crystal grains of 0.5 nm to 20.0 nm in size are contained in at least a part of a semiamorphous semiconductor film, and in the Raman spectrum, the peak specific to silicon shifts to the lower side of a wave number of 520 $cm^{-1}$, and a diffraction peak of (111) and (220) derived from a silicon crystal lattice is observed in x-ray diffraction. Further, the semiamorphous semiconductor film contains hydrogen or halogen of at least 1 atom % as a terminator for a dangling bond.

SAS can be obtained by glow discharge decomposition of a silicide gas. As a typical silicide gas, $SiH_4$ is cited, besides, $Si_2H_6$, $SiH_2Cl_2$, $SiHCl_3$, $SiCl_4$, $SiF_4$ and the like can be used. SAS can be formed easily by a silicide gas diluted with hydrogen, or hydrogen and one or more rare gas elements selected from helium, argon, krypton, and neon. The silicide gas is preferably diluted so that the dilution rate is in the range of 10 times to 1000 times. SAS can be also formed with $Si_2H_6$ and $GeF_4$ by a method of diluting them with a helium gas. The reactive formation of a film by grow discharge decomposition is preferably conducted under low pressure, and the pressure may be about 0.1 Pa to 133 Pa. The power for grow discharge may be 1 MHz to 120 MHz, preferably, a high frequency power of 13 MHz to 60 MHz. The substrate heating temperature is preferably 300° C. or less, and more preferably, substrate heating temperature of 100° C. to 250° C. is recommended.

A crystalline semiconductor film can be formed by crystallizing an amorphous semiconductor film by heating or laser light irradiation. Alternatively, a crystalline semiconductor film itself may be formed. In this case, a crystalline semiconductor film itself can be formed with the use of heat or plasma using a fluorine-based gas such as $GeF_4$ or $F_2$, and silane-based gas such as $SiH_4$ or $Si_2H_6$.

The amorphous semiconductor film can be formed by another known technique (such as sputtering, LPCVD, or plasma CVD). Then, for example, a solution containing a metal element (Nickel or the like) which promotes silicon crystallization may be hold on the amorphous semiconductor film, and dehydrogenation (at 500° C. for one hour) is performed on the amorphous semiconductor film. Thereafter, thermal crystallization (at 550° C. for four hours) is carried out to form a crystalline semiconductor film. The crystallinity may subsequently be improved by further irradiation with laser light.

Further, in the case of forming a crystalline semiconductor film by laser crystallization, a pulsed or continuous-wave excimer laser, a YAG laser, a $YVO_4$ laser, YLF laser, a $YAlO_3$ laser, an amorphous laser, a ruby laser, a Ti: sapphire laser, or the like can be used. As to the pulsed emission type, a laser having a frequency of MHz level can also be used. In the case of using such a laser, the semiconductor film may be irradiated with a laser beam emitted from a laser oscillator, which is focused in a linear shape using an optical system. The conditions of crystallization can be appropriately selected by an operator.

Note that the first semiconductor region can be directly formed into an island shape by a printing method, a spraying method, a droplet discharge method and the like using an organic semiconductor material. In this case, since etching is not required, the number of steps can be reduced. It is preferable that the organic semiconductor material used for the invention be a π-electron conjugated high molecular weight material having a conjugated double bond as its backbone. A soluble high molecular weight material such as polythiophene, poly (3-alkylthiophene), polythiophene derivative, and pentacene can be typically used.

As another organic semiconductor material which can be used in the invention, a material which can form a second semiconductor region by being treated after depositing a soluble precursor can be used. Such an organic semiconductor material which is formed through a precursor includes polythienylene vinylene, poly (2, 5-thienylene vinylene), polyacetylene, a polyacetylene derivative, polyarylenevinylene, and the like.

In transforming the precursor into an organic semiconductor, a reactive catalyst such as hydrogen chloride gas is added as well as heat treatment is applied. A solvent for dissolving the soluble semiconductor material is typically toluene, xylene, chlorobenzene, dichlorobenzene, anisole, chloroform, dichloromethane, γ butyl lactone, butylcellosolve, cyclohexane, NMP (N-methyl-2-pyrrolidone), cyclohexanone, 2-butanone, dioxane, dimethylformamide (DMF), or THF (tetrahydrofuran).

Next, a second semiconductor film having one conductivity 304 is formed. In the case of forming an n-channel TFT, the second semiconductor film having one conductivity 304 is added with an element of group 15 of the periodic table, typically, phosphorus or arsenic. In the case of forming a p-channel TFT, an element of group 13 of the periodic table, typically boron, is added. The second semiconductor film 304 is deposited by plasma CVD by using a silicon gas added a gas containing an element of group 13 or 15 such as boron, phosphorus, or arsenic.

After forming the second semiconductor film 304, heat treatment maybe carried out. For example, if the semiconductor film 303 is crystallized using a metal element (nickel or the like), the metal element contained in the first semiconductor film is gettered in the second semiconductor film by the heat treatment.

Subsequently, the second semiconductor film having one conductivity 304 and the first semiconductor film 303 are etched into a desired shape. Here, a mask pattern is formed over the second semiconductor film 304 by a method of Embodiment Mode 2; thus, the semiconductor films are etched into the desired shape.

First, a first film is formed over the second semiconductor film 304. The first film has the same function as the first film used in forming the gate electrode. In other words, low wettability regions and a high wettability region are formed over the second semiconductor film. The first film can be one described in Embodiment Mode 1 or Embodiment Mode 2.

Next, a second mask is formed by discharging a solution containing a material of the second mask onto the first film. The material of the second mask and the solvent may be the same mask material and the solvent described in Embodiment Mode 1 or Embodiment Mode 2.

Low wettability regions (a region where the island shape first film 110 is formed) and a high wettability region (a region where the island shape first film 110 is not formed) are formed. The second mask is removed thereafter.

A third mask 305 is formed on the high wettability region provided between the low wettability regions. The third mask may be formed of the same material as the first mask or the second mask. However, a heat resistant high molecular weight material can also be used. Specifically, a high molecular substance containing an aromatic ring and a cyclic ring as backbone, which has less aliphatic portion and contains heteroatom groups can be used. Polyimide and polybenzimidazole can be given as representative examples for such a high molecular weight substance.

Next, the patterned first film, the second semiconductor film and the first semiconductor film are etched into the desired shape with the use of the third mask 305. The first semiconductor region 312 and the second semiconductor region 313 having desired shapes are formed correspondingly. As an etching gas, chlorine gas represented by $Cl_2$, $BCl_3$, $SiCl_4$, $CCl_4$ and the like, a fluorine gas represented by $CF_4$, $SF_6$, $NF_3$, $CHF_3$ and the like, or $O_2$ can be used. The third mask 305 is removed after the etching.

Next, a source electrode and a drain electrode 314 (hereinafter also referred to as source and drain electrodes 314) are formed over the second semiconductor region 313 using a conductive material. As the conductive material, a material similar to the material of the gate electrode 301 which is dissolved or dispersed in a solvent can be used. Here, a composition containing Ag (hereinafter referred to as an Ag paste) is used to form each electrode to a thickness of 600 to 800 nm through steps similar to the steps for forming the gate electrode, that are described in Embodiment Mode 1.

When the Ag paste is baked in $O_2$ atmosphere, an organic substance such as a binder (thermosetting resin) contained in the Ag paste is decomposed, thus, an Ag film containing few organic substances can be formed. Moreover, a surface of the film can be planarized. By discharging the Ag paste under reduced pressure, the solvent in the paste is volatilized and the subsequent heat treatment can be omitted or the time of heat treatment can be shortened.

The source and drain electrodes 314 are formed by etching after depositing a conductive film in advance by sputtering or the like and forming a mask through the steps shown in Embodiment Mode 2. The mask can also be formed of the aforementioned material.

Figure 3C:
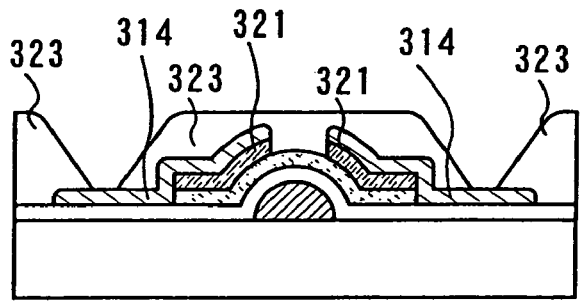
Figure 3D:
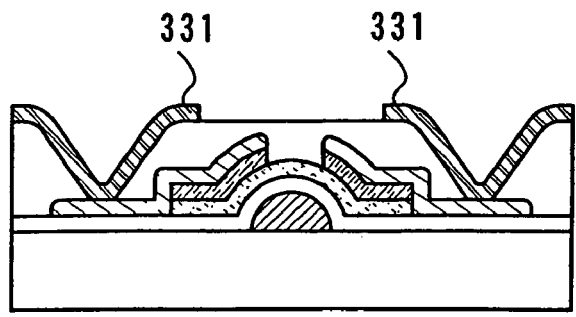

Next, as shown in FIG. 3C, the first semiconductor region 312 is exposed by etching the second semiconductor region using the source and drain electrodes 314 as masks. Here, parts of the second semiconductor region separated by etching are denoted as third semiconductor regions 321.

In the case of using an organic semiconductor for the first semiconductor region 312, a conductive layer formed of an organic conductive material such as polyacetylene, polyaniline, PEDOT (poly-ethylyenedioxythiophen), or PSS (poly-styrenesulphonate) can be formed instead of the third semiconductor region 321. The conductive layer functions as a contact layer, a source electrode or a drain electrode.

Moreover, a conductive layer formed of a metal element can be used instead of the third semiconductor region 321. In this case, as most of organic semiconductor materials are p-type semiconductors in which a charge transporting material transports holes as carriers, it is preferable to use metal having high work function in order to obtain an ohmic contact with the semiconductor layer.

Specifically, a metal of gold, platinum, chromium, palladium, aluminum, indium, molybdenum, nickel or the like, or an alloy thereof is preferable. The conductive layer can be formed by a method shown in the above Embodiment Mode 1 or 2 with the use of a conductive paste using these metal or alloy material.

Further, the first semiconductor region formed of an organic semiconductor material, a conductive layer formed of an organic conductive material, and a conductive layer formed of a metal element may be stacked.

Next, it is preferable to form a passivation film 323 over the source and drain electrodes 314. The passivation film can be formed of silicon nitride, silicon oxide, silicon nitride oxide, silicon oxynitride, aluminum oxynitride, or aluminum oxide, diamond-like carbon (DLC), nitrogen-containing carbon (CN) or another insulating material by a thin film formation method such as plasma CVD method or sputtering.

Next, a contact hole is formed in the passivation film, and a wiring or a pixel electrode 331 which is connected to the source and drain electrodes is formed thereafter.

The contact hole can be formed by a method shown in Embodiment Mode 2. A mask is formed in a region on the passivation film other than a part where the contact hole is formed, and the passivation film is etched using the mask to form the contact hole.

Subsequently, a conductive films 331 each of which connects to the source electrode and the drain electrode are formed. Here, a paste obtained by dissolving or dispersing a conductive material in a solvent is discharged to form the conductive film. As the conductive material for the conductive film, the same material as that of the source electrode and the drain electrode can be used. Note that the conductive film 331 functions as a connection wiring or a pixel electrode.

Through the above steps, a channel-etch type TFT can be manufactured. In this embodiment mode, a method for manufacturing a channel etch TFT has been described; however, it is obvious that the present invention is not limited to the type. For example, a channel protective type TFT can also be formed according to the invention.

In the case of the channel protective type, after the first semiconductor film is formed, an insulating film for protecting the channel is to be formed. Here, the insulating film can be formed by a method used for forming the gate electrode. Specifically, the first film is formed over the first semiconductor film, and a mask is formed thereover by discharging a solution containing the mask material.

Part of the first film which is not masked is thereafter removed using the mask to form low wettability regions and a high wettability region over the second semiconductor film. In this case, the insulating film for protecting the channel is formed in the high wettability region. A solution containing an insulating material is discharged to the high wettability region provided between the low wettability regions by a droplet discharge method.

Next, baking is carried out to form an insulating film for protecting the channel. The material for the first film, the material and the solvent for forming the mask, the insulating film for protecting the channel, or the like described in Embodiment Mode 1 or Embodiment Mode 2 can be used in addition to the ones described in this embodiment mode.

Subsequently, a second semiconductor film is formed, and the first semiconductor film and the second semiconductor film are patterned into a desired shape. The source and drain electrodes are formed by a method described above by etching the second semiconductor film using the source and drain electrodes as masks.

Embodiment Mode 4

In this embodiment, steps of forming a top gate coplanar TFT will be described with reference to FIGS. 4A to 4D.

Figure 4A:
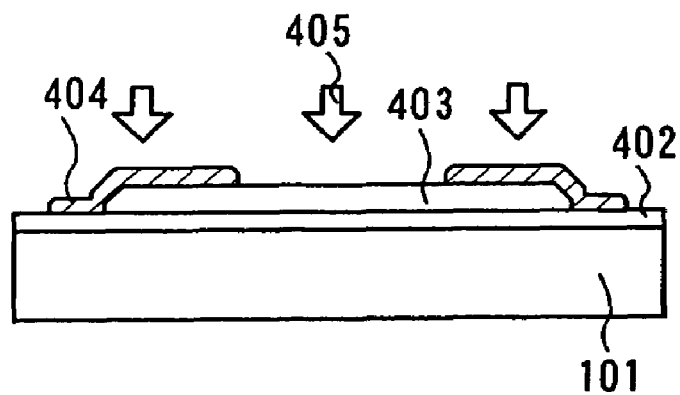
FIGS. 4A to 4D are cross-sectional views showing manufacturing steps of a semiconductor device according to the present invention.

As shown in FIG. 4A, a first insulating film 402 is formed over the substrate 101. The first insulating film, which is provided for preventing impurities from entering the TFT from the substrate 101, is formed of a silicon oxide film, a silicon nitride film, a silicon oxynitride film, a silicon nitride oxide film, or the like by a known method such as PVD and CVD. In the case where the substrate 101 is formed of a material from which impurities do not enter the TFT, that is representatively quartz and the like, the first insulating film 402 is not required to be formed.

Next, a semiconductor film 403 is formed over the first insulating film 402. The semiconductor film 403 is formed by etching the first semiconductor film 303 described in Embodiment Mode 3 a desired shape by the method in Embodiment Mode 1 or 2.

Figure 4B:
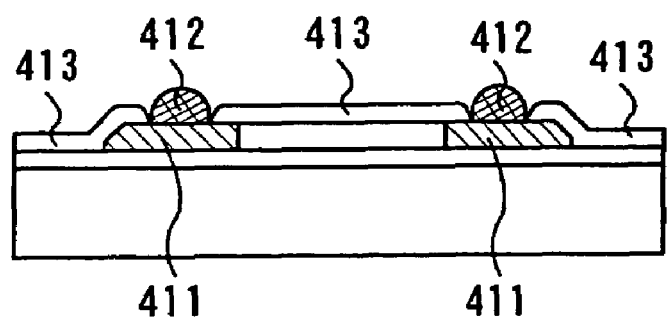

Next, after discharging a solution 404 containing impurities of group 13 or 15 of the periodic table onto parts of the semiconductor film 403 which are to be a source region and a drain region, laser light 405 is applied. Through the steps, conductive semiconductor regions (a source region and a drain region) 411 can be formed as shown in FIG. 4B. Accordingly, it is preferable that the solution containing impurities of group 13 or 15 of the periodic table be discharged onto the semiconductor region which is to be a source region and a drain region later. In the case where the semiconductor film 403 is an amorphous film or the like, a part of the semiconductor film that is what is called a channel region may occasionally be crystallized.

Next, as shown in FIG. 4B, a first film 412 is formed over the source region and the drain region 411. The first film 412 is provided for preventing the formation of a gate insulating film and an interlayer insulating film that are to be formed later; therefore, it is preferable to discharge the material of the first film 412 onto a region where a contact hole and a connection wiring are formed later. The first film 412 is formed by appropriately using a similar material and a method for forming the first film shown in Embodiment Mode 1, Embodiment Mode 2, or Embodiment Mode 3. Specifically, the first film is formed over the entire surface, and a mask is thereafter formed in each region where the contact hole or the connection wiring is to be formed. Part of the first film which is not covered with the masks is removed. The portion left without being removed is to be the first film 412. The mask over the first film 412 is removed thereafter.

Next, a material which has high wettability such as an organic SOG such as siloxane polymer or polysilazane, or an inorganic SOG are formed by a droplet discharge method or a coating method, and a gate insulating film 413 is formed through drying and baking. Note that the organic SOG or inorganic SOG is repelled by the first film to be formed in a region between the first films 412.

A gate electrode 421 is formed on the gate insulating film 413 between the source region and the drain region 411 over the semiconductor film 403. The gate electrode 421 is formed by appropriately using a similar material and a method for forming the gate electrode 301 described in Embodiment Mode 3.

Next, an interlayer insulating film 323 is formed by applying a solution containing an insulating material which has high wettability. Since the region provided with the first film 412 has low wettability; thus, the solution containing an insulating material is repelled. Consequently, the interlayer insulating film can be formed in the region between the first films 412.

Figure 4C:
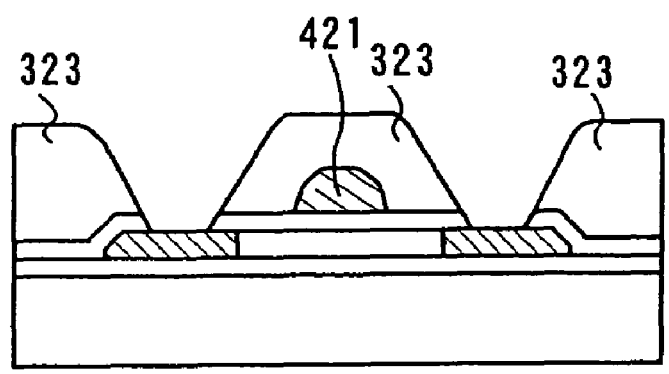
Figure 4D:
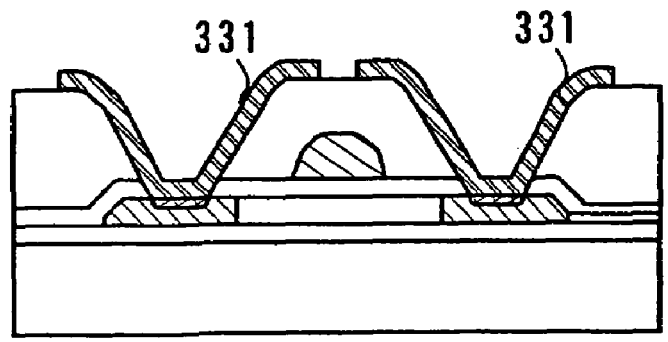

Next, the first film is removed (FIG. 4C). Next, conductive films 331 are formed by a method shown in Embodiment Mode 2 (FIG. 4D).

Through the aforementioned steps, a top gate coplanar TFT can be formed.

Embodiment Mode 5

Figure 16:
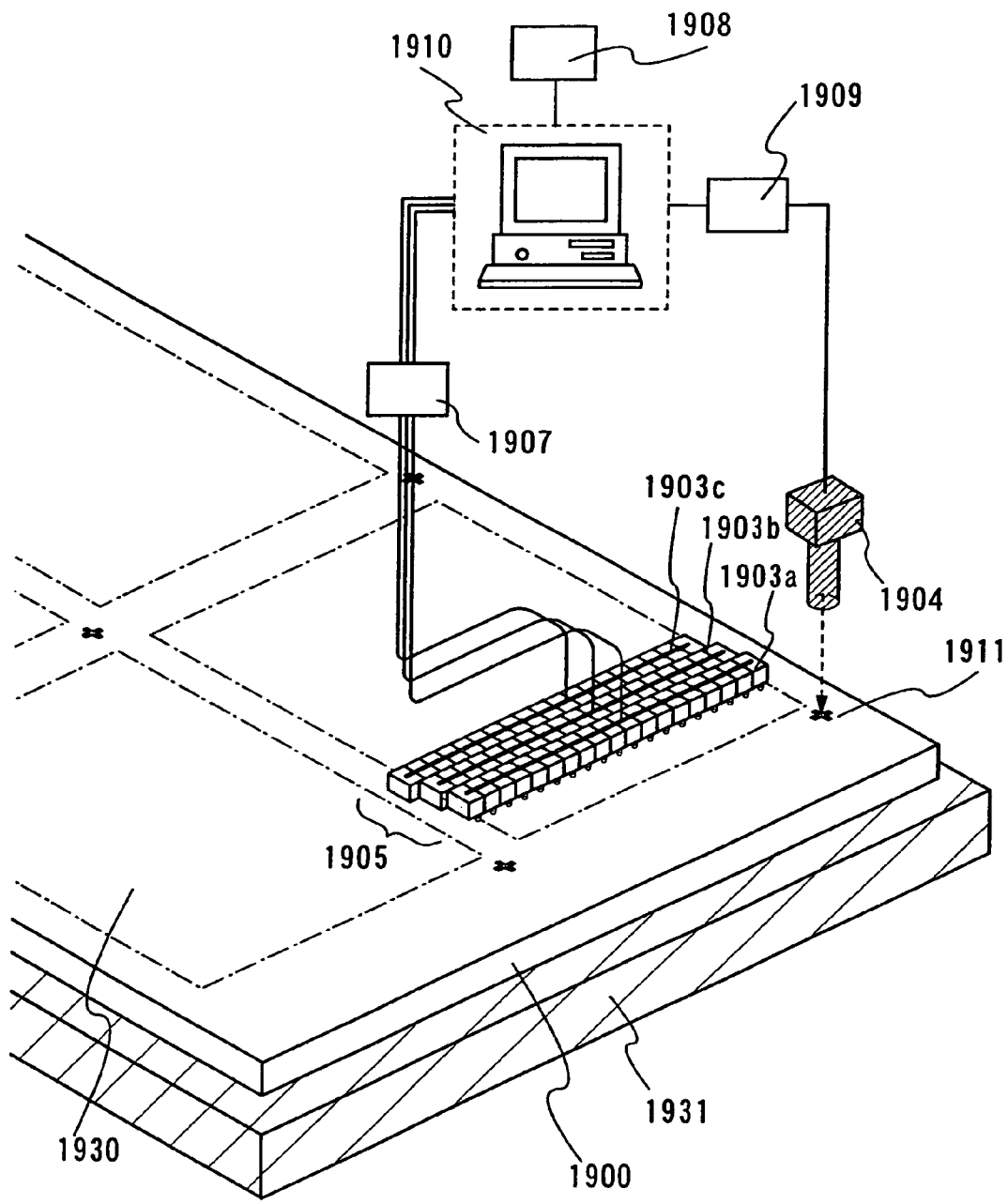
FIG. 16 is a figure showing a structure of a droplet discharge system which is adaptable to the present invention.

In this embodiment mode, a droplet discharge system which can be used for forming the pattern in the aforementioned embodiment modes will be described. In FIG. 16, a region where one panel 1930 is formed on a substrate 1900 is shown by dotted lines.

A mode of the droplet discharge system for forming a pattern of a wiring or the like is shown in FIG. 16. A droplet discharge means 1905 has a head which includes a plurality of nozzles. In this embodiment mode, three heads (1903a, 1903b, and 1903c) each of which has ten nozzles are provided. However, the number of nozzles and heads can be set according to the process area and steps.

Heads are connected to a control means 1907. A computer 1910 controls the control means 1907, so that a preprogrammed pattern can be drawn. For example, the pattern may be drawn using a marker 1911, as a reference point, formed over the substrate 1900 that is fixed on a stage 1931. Alternatively, the edges of the substrate 1900 may be used as a reference point. Such a reference point is detected by an imaging means 1904 such as a CCD, and converted into a digital signal by an image processing means 1909. The computer 1910 recognizes the digital signal and generates a control signal which is sent to the control means 1907. In drawing a pattern in this manner, it is preferable that distance between a distal end of a nozzle and the surface on which a pattern is formed be 0.1 to 5 cm, preferably 0.1 to 2 cm, more preferably about 0.1 cm. Such a short distance improves the accuracy of applying droplets.

Here, data on the pattern to be formed on the substrate 1900 is stored in a memory medium 1908. Based on this data, a control signal is sent to the control means 1907, which can control each head 1903a, 1903b, and 1903c independently. Further, each nozzle of the head 1903a, 1903b, and 1903c can respectively discharge droplets containing different materials. For example, the nozzles of the heads 1903a and 1903b discharge droplets containing an insulating material, and the nozzle of the head 1903c can discharge droplets containing a conductive material.

Further, each nozzle of the head can also be controlled independently. As the nozzles can be controlled independently, droplets containing different materials can be discharged from specific nozzles. For example, a nozzle for discharging droplets containing a conductive material and a nozzle for discharging droplets containing a material of an insulating film can be provided on the head 1903a, for example.

In the case of performing the droplet discharge treatment on a large area as in a step of forming an interlayer insulating film, it is preferable to discharge droplets containing a material of an interlayer insulating film from all the nozzles. Further, it is preferable to discharge droplets containing a material for an interlayer insulating film from all the nozzles of the plurality of heads. Consequently, the throughput can be improved. Needless to say, the droplet discharge treatment can be performed on a large area by discharging droplets containing a material of an interlayer insulating film from one nozzle and by scanning at a plurality of times in the step of forming an interlayer insulating film.

By moving the head back and forth or in zigzag, a pattern can be formed on a large mother glass. At this time, it is preferable to move the head and the substrate relatively a plurality of times. In scanning the head against the substrate, it is preferable to slant the head against a direction of movement.

In the case of forming a plurality of panels using a large mother glass, it is preferable that the width of the head be almost the same as the width of one panel. This is because a pattern can be formed by one-time operation over a region where one panel 1930 is to be formed; thus, high throughput can be expected.

The width of the head may be smaller than the width of the panel. At this time, a plurality of heads having small width may be arranged in series so as to correspond to the width of one panel. By disposing a plurality of heads having small width in series, flexure of the head can be prevented which is likely to be caused as the width of the head is larger. Needless to say, a pattern may be formed by moving a head having small width a plurality of times.

It is preferable that a step of discharging droplets of the solution by a droplet discharge method be performed under reduced pressure. This is because the solvent in the solution is volatilized before the discharged solution reaches the object being processed, and the steps of drying and baking the solution can be omitted accordingly. Further, it is preferable to perform the treatment under reduced pressure since an oxide film and the like are not formed on the surface of the conductor. A step of dropping the solution may also be performed in a nitrogen atmosphere or an organic gas atmosphere.

As the droplet discharge method, a piezoelectric method can be employed. The piezoelectric method is utilized for an ink jet printer for its superior controllability of droplets and high degree of freedom in selecting an ink. The piezoelectric method includes an MLP (Multi Layer Piezo) type, an ML Chip (Multi Layer Ceramic Hyper Integrated Piezo Segments) type. Depending on the solvent of the solution, the droplet discharge method using what is called a thermal method, by which a heating medium is heated to generate bubbles thereby squeezing out the solution, may be used.

Embodiment 1

A method for forming a silver wiring will be described with reference to FIGS. 5A to 5D and FIGS. 6 and 7.

Figure 5A:
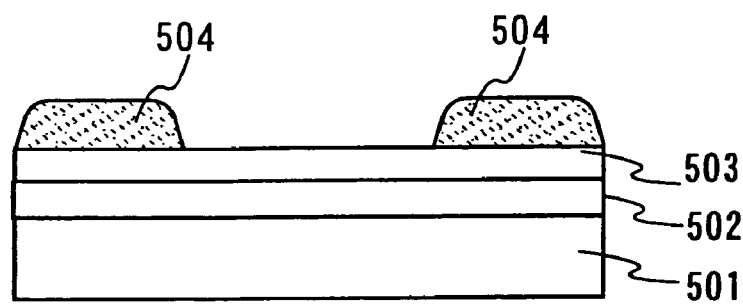
FIGS. 5A to 5D are cross-sectional views showing manufacturing steps of a semiconductor device according to the present invention.

As shown in FIG. 5A, a silicon nitride film 502 is formed on the surface of the substrate 501. An AN100 glass substrate from ASAHI GLASS CO., LTD. is used as the substrate 501.

Next, a heptadecafluorodecyltrimethoxysilane (GE Toshiba Silicones TSL8233) layer 503 (hereinafter referred to as a "first film" in this embodiment) is adsorbed on a silicon nitride film 502. Here, a solution in which heptadecafluorodecyltrimethoxysilane is diluted is applied and adsorbed onto the silicon nitride film.

First mask patterns 504 are formed over the first film 503. The first masks are formed to be patterns having line width of 60 μm by discharging a mixture of polyimide solution (DL1602 (65 wt %); Toray), heptadecafluorodecyltrimethoxysilane (5 wt %), and dipropylene glycol monomethyl ether (30 wt %). The distance between the first masks is set at 100 μm. Here, heptadecafluorodecyltrimethoxysilane is added as a surfactant. The surface tension at this point is 20.5 mN/m and the static contact angle is 35°. Further, the substrate temperature is set at 60° so as to further thickening polyimide by removing the solvent (FIG. 6).

Thus, the region of the first film where the first mask patterns 504 are not formed is to be exposed (FIG. 5A).

Figure 5B:
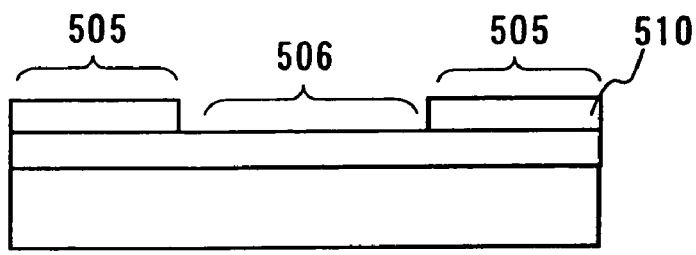

Next, treatment using a UV ozone cleaner is performed for 10 minutes and the region of the first film 503 where the first mask pattern is not formed is decomposed and removed. An island shape first film 510 is formed by peeling the first mask pattern 503 using a peeling agent. Thus, a high wettability region 506 (where the first film is not formed) and low wettability regions 505 (where the first film is formed) are formed in the substrate (FIG. 5B).

Figure 5C:
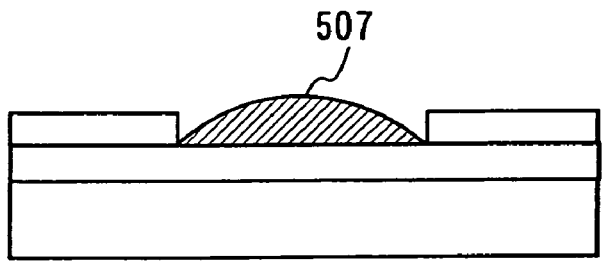
Figure 5D:
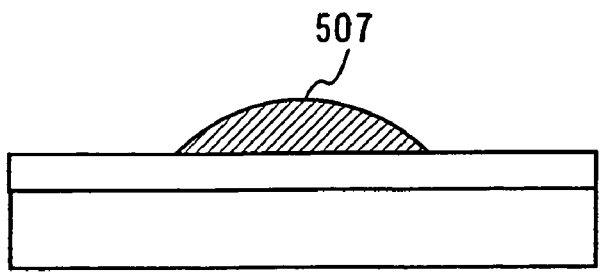
Figure 7:
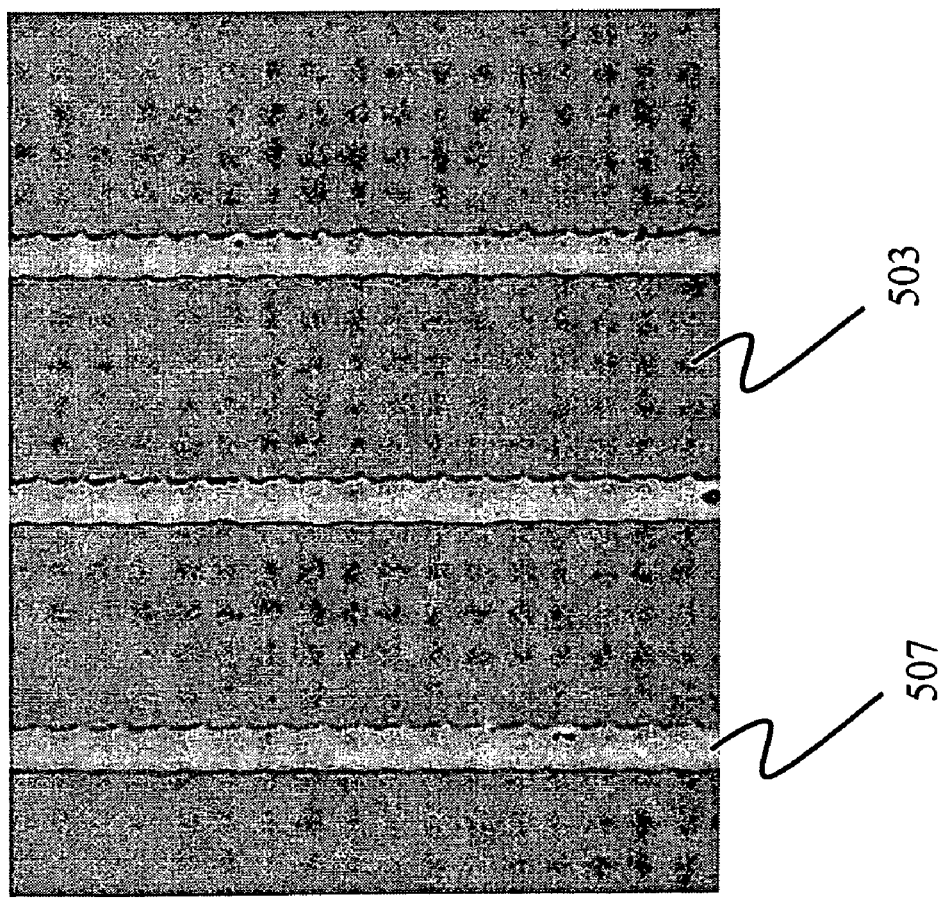
FIG. 7 is a figure showing a manufacturing steps of a semiconductor device concerning the according to the present invention.

Silver paste (a product from Harima Chemicals) is discharged to the region 506 between the island shape first films. The static contact angle on the first films is 55°. Baking is thereafter carried out at 230° C. using an oven. Thus, a silver wiring 507 with a line width of 100 μm can be formed (FIG. 5C, FIG. 7). The island shape first film is thereafter removed by UV ozone cleaning (FIG. 5(D)).

Here, the first film is formed, the first mask pattern is formed thereover using a solution in which the contact angle is reduced by adding a surfactant, and the first film is patterned, thereby forming low wettability regions (where the first film is formed) and the high wettability region (where the first film is not formed). A solution (Ag paste, here) having high contact angle is discharged to the high wettability region. In such a manner, a fine line pattern can be formed more easily without being subjected to the so-called photolithography process without damaging the substrate.

Embodiment 2

A method for patterning a transparent electrode will be described.

As shown in FIG. 2A, heptadecafluorodecyltrimethoxysilane (GE Toshiba Silicones XC98-A5382) film 102 (hereinafter referred to as a "first film" in this embodiment) is adsorbed on a substrate 101 over which a transparent electrode (ITO, ITO containing silicon oxide, IZO, or the like) is formed. Here, a solution in which heptadecafluorodecyltrimethoxysilane is diluted is applied and adsorbed onto the transparent electrode.

First mask patterns 103 are formed over the first film 102. The first mask patterns are formed by discharging a mixture of polyvinyl alcohol (product made by Kuraray co, Ltd., LM25S0 (10 wt %)) dissolved in a solution of methyl ethyl ketone and dipropylene glycol monomethyl ether (methyl ethyl ketone:dipropylene glycol monomethyl ether=1:1), and a surfactant of heptadecafluorodecyltrimethoxysilane (XC98-A5382 (1 wt %)) by a droplet discharge method. Thus, a pattern having a line width of 60 μm is formed. The interval is set to be 500 μm. The surface tension is 18 mN/m and the static contact angle on the first film is 36°. Further, the substrate temperature is set at 50° so as to further thickening polyimide.

Figure 8:
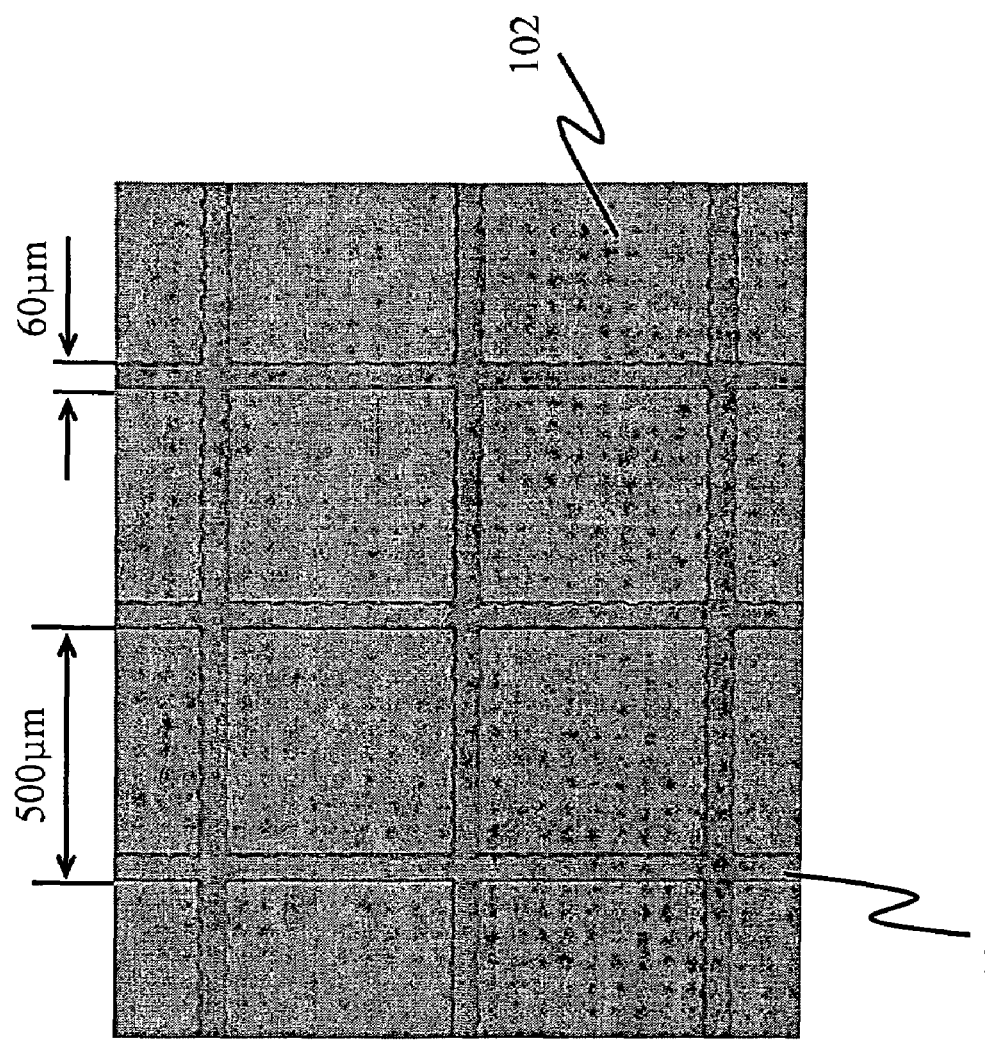
FIG. 8 is a figure showing a manufacturing steps of a semiconductor device concerning the according to the present invention.

Thus, the region of the first film where the first mask patterns are not formed is to be exposed (FIG. 2A, FIG. 8).

Next, treatment using a UV ozone cleaner is performed for 10 minutes and a region of the first film 102 where the first mask pattern is not formed is decomposed and removed. An island shape first film 210 is formed by peeling the first mask pattern 102 using ethanol. Thus, a high wettability region (where the first film is not formed) 105 and low wettability region (where the first film is formed) 104 are formed in the substrate (FIG. 2B).

Figure 9:
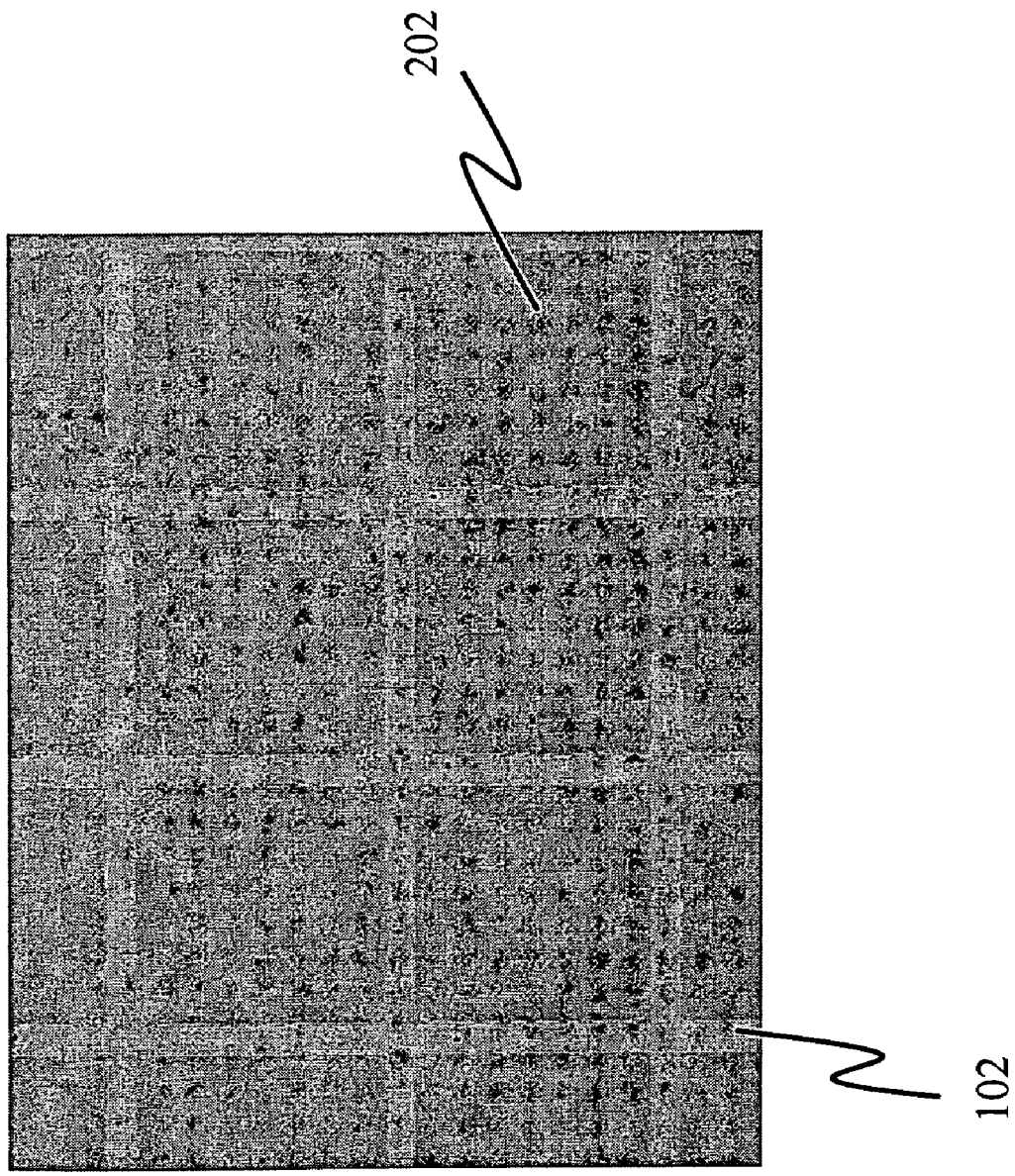
FIG. 9 is a figure showing a manufacturing steps of a semiconductor device concerning the according to the present invention.

A second mask pattern 202 is formed over the region 105 where the first film is not formed (FIG. 2C). A polyimide solution (DL1602; Toray, solvent: butyrolactone:ethyl lactate=1:1) is discharged over the entire surface of the substrate provided with the first film by a droplet discharge method to form the second mask pattern 202. The high wettability region 105 and low wettability regions 104 are formed in the substrate; accordingly, the polyimide solution is applied to the high wettability region 105. The surface tension on the first film is 31 mN/m, and the static contact angle is 68°. The substrate is not heated in applying the polyimide solution (FIG. 9). A baking process may be added thereafter.

As shown in FIG. 2D, the mask pattern 202 is used to pattern the island shape first film and the transparent electrode there under by etching. Thus, transparent electrode patterns having the interval of 500 μm at 60 μm spacing can be formed. Subsequently, the second mask pattern is removed (FIG. 2E).

Here, the first film is formed over the transparent electrode, the first mask pattern is formed thereover using a solution in which the contact angle is reduced by adding a surfactant, and the first film is patterned, thereby forming low wettability regions and the high wettability region. A solution (here, polyimide solution) having high contact angle is discharged to the high wettability region thereby forming the second mask. The transparent electrode is etched using the mask. In such a manner, a transparent electrode can be patterned more easily without being subjected to the so-called photolithography process without damaging the substrate.

Embodiment 3

Next, a method for patterning an insulating film will be described.

As shown in FIG. 2A, an octadecyltrimethoxysilane film 102 (hereinafter referred to as a "first film" in this embodiment) is adsorbed onto a substrate 101 over which a silicon oxide film 201 is formed. Here, a solution in which octadecyltrimethoxysilane is diluted is applied and adsorbed onto the silicon oxide film.

A first mask pattern 103 is formed over the first film 102. A mixture of polyimide solution (DL1602 (65 wt %); Toray), heptadecafluorodecyltrimethoxysilane (5 wt %), and dipropylene glycol monomethyl ether (30 wt %) is discharged by a droplet discharge method to form the first mask pattern with a line width of 10 μm. Here, heptadecafluorodecyltrimethoxysilane is added as a surfactant.

Thus, the region of the first film where the first mask patterns are not formed is to be exposed.

Next, treatment using a UV ozone cleaner is performed for 10 minutes and a region of the first film 102 where the first mask pattern is not formed is decomposed and removed. An island shape first film 210 is formed by peeling the first mask pattern 102. Thus, a high wettability region (where the first film is not formed) 105 and low wettability region (where the first film is formed) 104 are formed in the substrate.

A second mask pattern is formed over the region 105 where the island shape first film is not formed. A polyimide solution is discharged over the entire surface of the substrate provided with the first film 210 by a droplet discharge method to form the second mask pattern 202. The high wettability region 105 and low wettability regions 104 are formed in the substrate; accordingly, the polyimide solution is applied to the high wettability region. The polyimide may be baked thereafter.

The first film 210 and the silicon oxide film 201 thereunder are patterned by etching using the second mask pattern 202 (FIGS. 2D and 2E).

Embodiment 4

Next, an embodiment of forming a inverted staggered TFT will be described with reference to FIG. 10A to 10D and the like.

A heptadecafluorodecyltrimethoxysilane (GE Toshiba Silicones XC98-A5382) film 1003 (hereinafter referred to as a "first film" in this embodiment) is applied and adsorbed on a glass substrate 101 over which a silicon oxide film 1002 is formed.

A first mask pattern 1004 is formed over the first film 1003. A mixture of polyimide solution (DL1602 (65 wt %); Toray), heptadecafluorodecyltrimethoxysilane (5 wt %), and dipropylene glycol monomethyl ether (30 wt %) is discharged by a droplet discharge method to form the first mask pattern with a line width of 10 μm. Here, heptadecafluorodecyltrimethoxysilane is added as a surfactant.

Figure 10A:
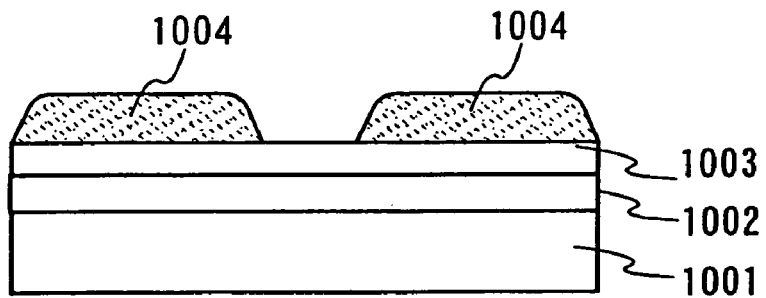
FIGS. 10A to 10D are cross-sectional views showing manufacturing steps of a semiconductor device according to the present invention.

Thus, the region of the first film where the first mask patterns are not formed is to be exposed (FIG. 10A).

Figure 10B:
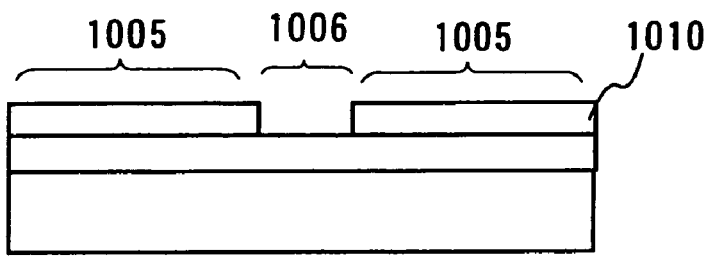

Next, treatment using a UV ozone cleaner is performed for 10 to 15 minutes and a region of the first film 1003 where the first mask pattern is decomposed and removed. An island shape first film 1010 is formed by peeling the first mask pattern 102 using a peeling agent. Thus, a high wettability region (where the first film is not formed) 1006 and low wettability region (where the first film is formed) 1005 are formed in the substrate (FIG. 10B).

Figure 10C:
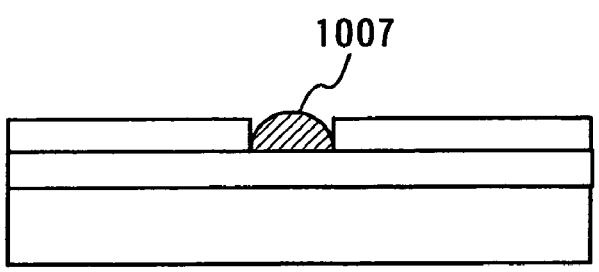
Figure 10D:
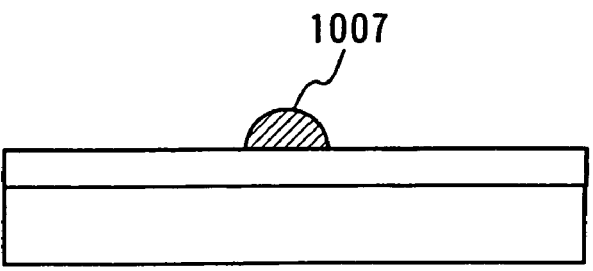

A solution in which particles of silver are dispersed in a solvent is discharged to the region 1006 between the first films. The solution is thereafter baked at 200° C. to 250° C. using an oven. Thus, a gate electrode 1007 having a line width of 10 μm can be formed (FIG. 10C). The island shape semiconductor film 1010 is treated thereafter with a UV ozone cleaner to be removed (FIG. 10D).

An gate insulating film 1008 is formed on the gate electrode 1007. The gate insulating film 1008 is formed with a laminate of a silicon nitride oxide film and a silicon oxynitride film by plasma CVD. The silicon nitride oxide film and the silicon oxynitride film are stacked in the order from the gate electrode layer side. The thickness thereof shall be 50 nm to 100 nm.

Next, an amorphous silicon film 1009 is formed over the gate insulating film 1008 by plasma CVD. The thickness shall be 100 nm to 200 nm.

Figure 11A:
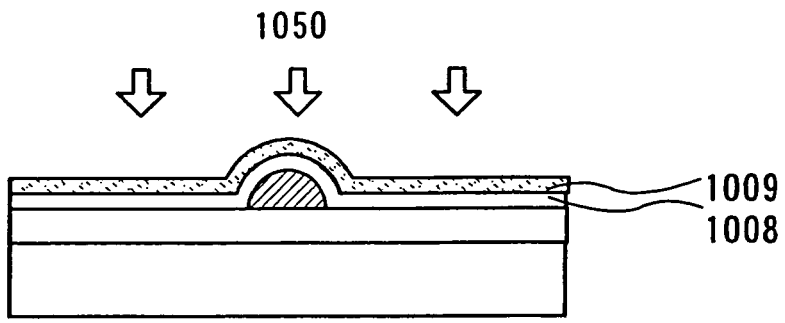
FIGS. 11A to 11D are cross-sectional views showing manufacturing steps of a semiconductor device according to the present invention.

Subsequently, an acetic acid solution containing nickel is applied by spin coating to be held over the amorphous semiconductor film; thus, the amorphous semiconductor film is dehydrogenated (at 500° C. for one hour). Further, thermal crystallization (at 550° C. for four hours) is carried out to form a crystalline silicon film 1011. The crystallinity if further improved by applying a laser beam 1050 of pulsed emission type having a repetition rate of MHz (FIG. 11A)

Next, a second amorphous film 1012 is formed by plasma CVD using a silicon-containing gas added with phosphorus element.

After the second amorphous silicon film 1012 is formed, heat treatment is conducted again at 550° C. Correspondingly, nickel inside the crystalline silicon film 1011 is gettered into the second amorphous silicon film 1012. Concurrently, the second silicon film may also crystallized by the heat treatment to be a second crystalline silicon film.

Next, the second amorphous or crystalline silicon film 1012 and the crystalline silicon film 1011 are etched into an island shape. First, the first film 1013 is adsorbed on the second amorphous or crystalline silicon film 1012.

Figure 11B:
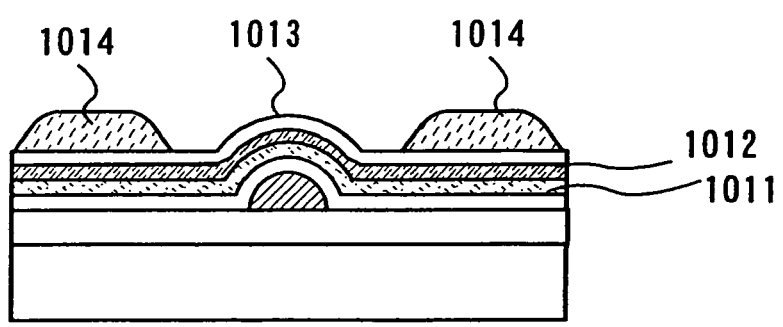

Over the first film, second masks 1014 are formed by discharging a mixture of polyvinyl alcohol dissolved in a solution of methyl ethyl ketone and dipropylene glycol monomethyl ether (methyl ethyl ketone:dipropylene glycol monomethyl ether=1:1), and a surfactant of heptadecafluorodecyltrimethoxysilane by a droplet discharge method (FIG. 11B).

The first film 1013 is patterned using the second masks 1014 to form the low wettability regions and a high wettability region over the second amorphous or crystalline silicon film 1012. Subsequently, the second mask is removed.

Figure 11C:
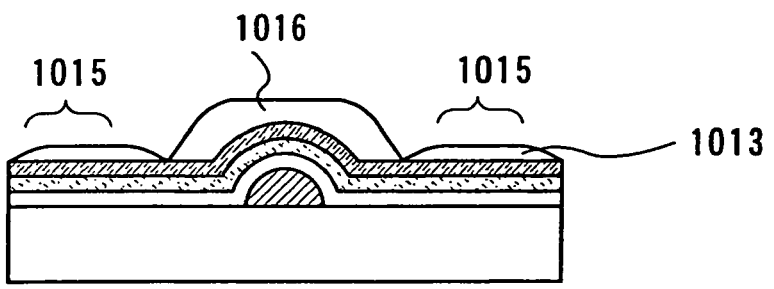

A solution containing polyimide is discharged to the high wettability region between the low wettability regions 1015 to form a third mask 1016 (FIG. 11C). A baking process may be added thereafter.

Figure 11D:

The patterned first film 1013, the second amorphous or crystalline silicon film 1012, and the crystalline silicon film 1011 are dry-etched to an island shape by using the third mask 1016. The third mask 1016 is removed after the etching (FIG. 11D).

Figure 12A:
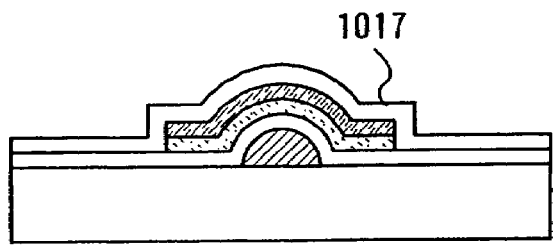
FIGS. 12A to 12E are cross-sectional views showing manufacturing steps of a semiconductor device according to the present invention.

Next, a source electrode and a drain electrode are formed over the second amorphous or crystalline silicon film 1012. Here, a Ti film, an Al film, and a Ti film are respectively formed by sputtering as a conductive film 1017 (FIG. 12A).

Figure 12B:
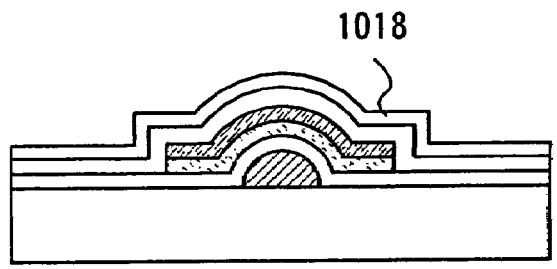

A first film 1018 is adsorbed on the Ti film on the top surface (FIG. 12B). Over the first film, a fourth mask (not shown) is formed by discharging a mixture of polyvinyl alcohol dissolved in a solution of methyl ethyl ketone and dipropylene glycol monomethyl ether (methyl ethyl ketone:dipropylene glycol monomethyl ether=1:1), and a surfactant of heptadecafluorodecyltrimethoxysilane by a droplet discharge method (FIG. 12A).

The first film is patterned using the fourth mask to form low wettability regions and a high wettability region. The fourth mask is removed thereafter.

A solution containing polyimide is discharged to the high wettability region between the low wettability regions to form a fifth mask (not shown).

Figure 12C:
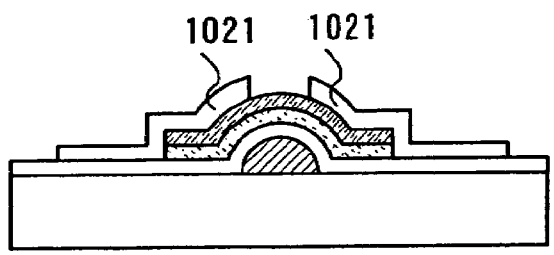

The patterned first film, the Ti film, the Al film, and the Ti film are dry etched using the fifth mask to form source and drain electrodes 1021. The fifth mask is removed after the etching (FIG. 12C).

Next, the second amorphous or crystalline silicon film 1012 is etched using the source and drain electrodes 1021 as masks to expose the crystalline silicon film 1022. Here, a part of the crystalline silicon film surface is also etched.

Figure 12D:
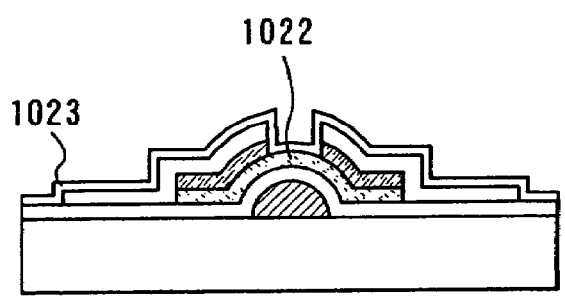

A passivation film 1023 is formed over the source electrode and drain electrodes 1021 (FIG. 12D).

Figure 12E:
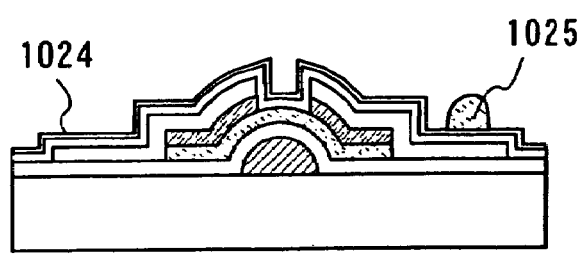

Subsequently, a first film 1024 is adsorbed. Over the first film, a sixth mask 1025 is formed by discharging a mixture of polyvinyl alcohol dissolved in a solution of methyl ethyl ketone and dipropylene glycol monomethyl ether (methyl ethyl ketone:dipropylene glycol monomethyl ether=1:1), and a surfactant of heptadecafluorodecyltrimethoxysilane by a droplet discharge method (FIG. 12E).

Next, a part of the first film where the sixth mask is not formed is removed. A contact hole is to be formed later in the part where the sixth mask is formed The sixth mask is removed thereafter (not shown).

Figure 13A:
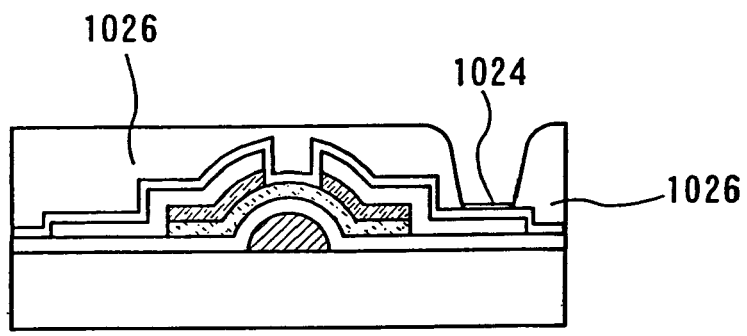
FIGS. 13A to 13C are cross-sectional views showing manufacturing steps of a semiconductor device according to the present invention.
Figure 13B:
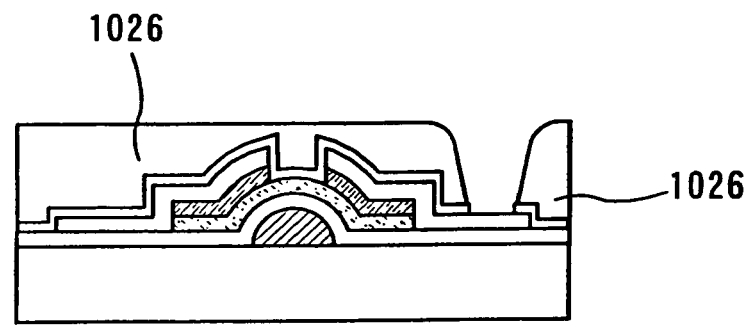
Figure 13C:
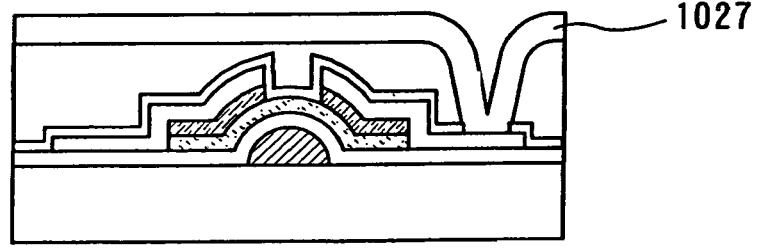

The region where the first film is formed becomes low wettability regions and the other region becomes a high wettability region. When a solution containing an interlayer insulating film is discharged, the interlayer insulating film 1026 is formed in the high wettability region, is not formed in the low wettability regions where the first film 1024 is formed (FIG. 13A). The passivation film 1023 is removed continuously to expose a part of the source or drain electrode (FIG. 13B). Next, the pixel electrode 1027 is formed by sputtering or the like (FIG. 13C).

A first film is adsorbed on the pixel electrode 1027. Over the first film, a seventh mask is formed by discharging a mixture of polyvinyl alcohol dissolved in a solution of methyl ethyl ketone and dipropylene glycol monomethyl ether (methyl ethyl ketone:dipropylene glycol monomethyl ether=1:1), and a surfactant of heptadecafluorodecyltrimethoxysilane by a droplet discharge method (not shown).

The first film is patterned using the seventh mask to form low wettability regions and a high wettability region. The seventh mask is removed later (not shown).

A solution containing polyimide is discharged to the high wettability region between the low wettability regions to form an eighth mask (not shown).

The patterned first film and the pixel electrode are etched using an eighth mask. The eighth mask is removed after the etching. Through the above steps, a channel etch TFT can be manufactured (not shown).

Embodiment 5

An example of manufacturing an active matrix device applying the method for manufacturing a TFT according to Embodiment 4 will be described in this embodiment. Here, a liquid crystal display panel will be described as a display panel.

Figure 14:
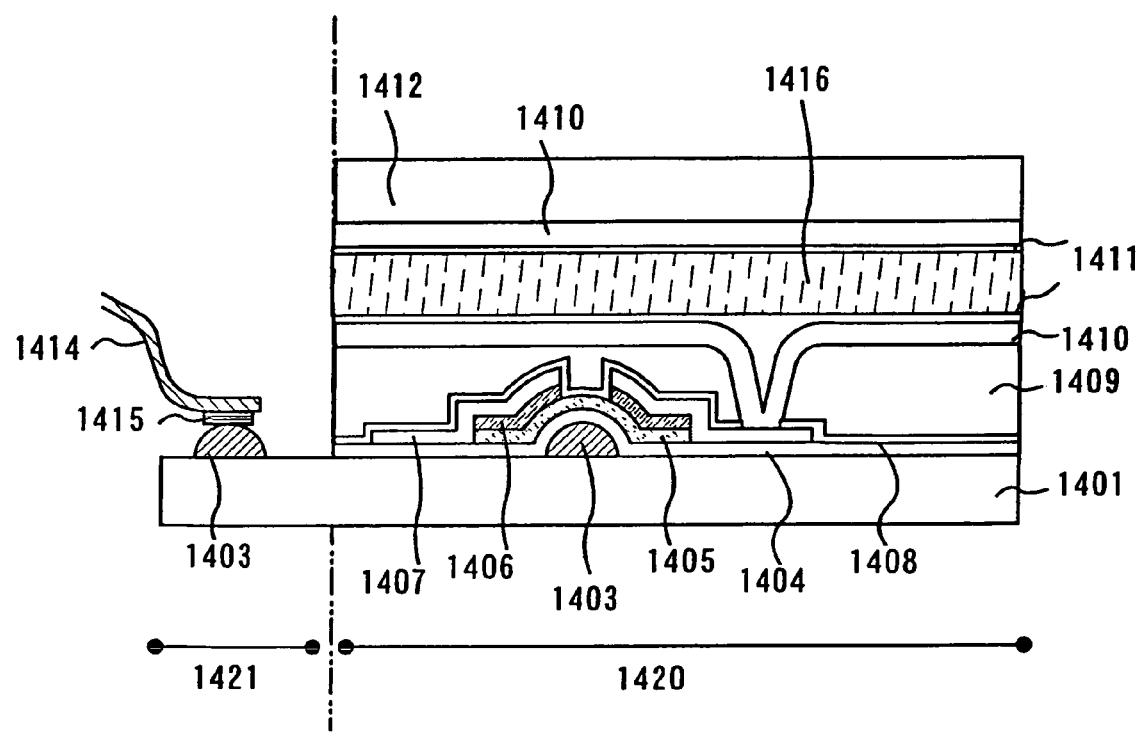
FIG. 14 is a cross-sectional view of a semiconductor device according to the present invention.

FIG. 14 is a cross-sectional view schematically showing a pixel area 1420 and a connection terminal 1421. A TFT can be manufactured by a method shown in Embodiment 4, and an auxiliary capacitor can be naturally manufactured concurrently with the TFT.

Reference numeral 1401 denotes a substrate, and 1412 denotes a counter substrate. Reference numeral 1403 denotes a gate electrode or a gate wiring, 1404 denotes a gate insulating film, 1405 denotes a semiconductor film, 1406 denotes an n channel or p channel semiconductor film, 1407 denotes a source electrode, a drain electrode, or a source line. Reference numerals 1408 denotes a passivation film and 1409 denotes an interlayer insulating film, 1410 denotes a pixel electrode, 1411 denotes an alignment layer, 1414 denotes a connection terminal, 1415 denotes an anisotropic conductive film, and 1416 denotes a liquid crystal material.

A composition containing indium tin oxide, zinc oxide, or tin oxide, or the like can be used for forming the pixel electrode 1410. In the case of manufacturing a reflective liquid crystal display device, a composition mainly containing metal particles of silver, gold, copper, tungsten, aluminum, or the like can be used.

An insulating film is formed by spin coating or a printing method and is rubbed to form the alignment layer 1411. Alternatively, the alignment layer can be formed by oblique deposition.

A sealing material is formed on the periphery of the substrate by a droplet discharge method, a dispensing method, or a printing method (not shown).

The liquid crystal material 1416 is dropped to the inside of a closed loop formed with a sealant by a dispensing method (dropping method).

Nematic liquid crystal, ferroelectric liquid crystal, anti-ferroelectric liquid crystal, or the like can be used as the liquid crystal material. A mode such as OCB or MVA can also be used as a liquid crystal mode.

A connection terminal (the connection terminal 1414 connected to the gate wiring layer and the connection terminal connected to the source wiring layer are not shown) is attached to each of the gate wiring layer 1403 and the source wiring layer (not shown) with the anisotropic conductive layer 1415 therebetween.

A protective circuit for preventing electrostatic discharge damage, typically a diode or the like may be provided in the pixel area or between the connection terminal and the source wiring (gate wiring). In this case, the diode can be manufacture through the like process for manufacturing the above TFT to connect the gate wiring layer of the pixel area and the drain or source wiring layer of the diode; thus, the diode can be operated.

Any one of Embodiment Mode 1 to Embodiment Mode 5 can be applied to this embodiment. Further, a method for manufacturing a liquid crystal display device as a display device has been described in this embodiment; however, the invention is not limited thereto. The invention can be applied to an active display panel such as a light emitting display device having a light emitting layer containing a light emitting material made of an organic material or an inorganic material, a DMD (Digital Micromirror Device), a PDP (Plasma Display Panel), an FED (Field Emission Display), and an electrophoresis display device (electronic paper).

Embodiment 6

In this embodiment, a display panel using a passive matrix substrate is described with reference to FIGS. 17A to 17D. In this embodiment, an EL (Electro Luminescence) display panel (a light emitting display panel) is described as an example of a display panel.

Figure 17A:
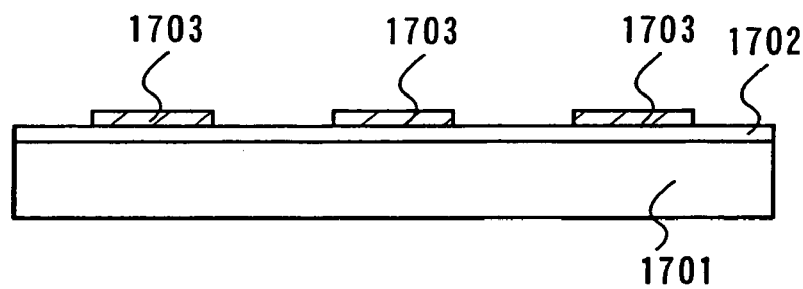
FIGS. 17A to 17D are cross-sectional views showing manufacturing steps of a semiconductor device according to the present invention.

As shown in FIG. 17A, a first pixel electrode 1702 formed of a light-transmitting conductive film is formed over a light-transmitting substrate 1701.

First, a first film is formed over the substrate 1701. Next, a solution containing a mask material is discharged to the first film to form a mask. A part of the first film whish is not masked is removed by treating the first film with UV ozone with the use of the mask. Thus, low wettability regions and a high wettability region are formed over the substrate. Further, a solution containing a composition of ITO, ZnO, and $SiO_2$ is discharged to the high wettability region by a droplet discharge method and baked to form a first pixel electrode. Note that the first pixel electrode is formed by discharging in parallel (not shown).

Next, a plurality of first insulating films 1703 are formed which perpendicularly cross the first electrode at even intervals on the first pixel electrode 1702. As the first insulating film, an insulating film of such as $SiO_2$ or SiN is formed and etched in parallel. Here, the first insulating film can be formed by a method shown in Embodiment Mode 2.

Figure 17B:
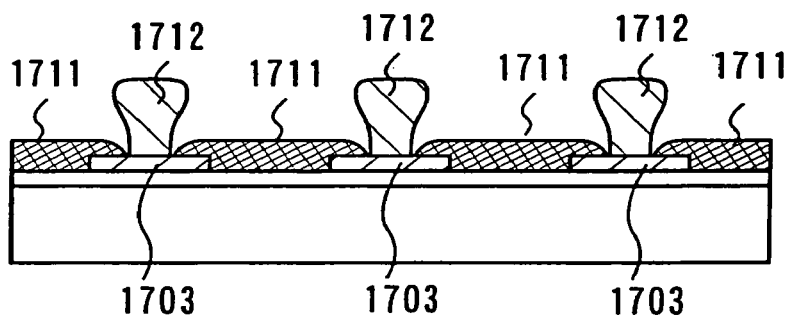

Next, as shown in FIG. 17B, a mask pattern 1711 is formed in a region where an organic EL layer is to be formed later, that is over a portion between the adjacent first insulating films 1703. First, a first film is formed over the entire surface and a solution containing a mask material is discharged thereto by a droplet discharge method to form a mask. Then, the first film is patterned by UV ozone treatment with the use of the mask.

Next, a solution containing an insulating material is discharged to a region where the mask pattern is not formed, that is an outer edge of the mask pattern, drying and baking are performed to form a second insulating film 1712. In this embodiment, polyimide is discharged.

Depending on the composition, viscosity, and surface tension of the solution, the second insulating film 1712 having a reverse tapered cross-section can be formed as shown in FIG. 17B.

Figure 18A:
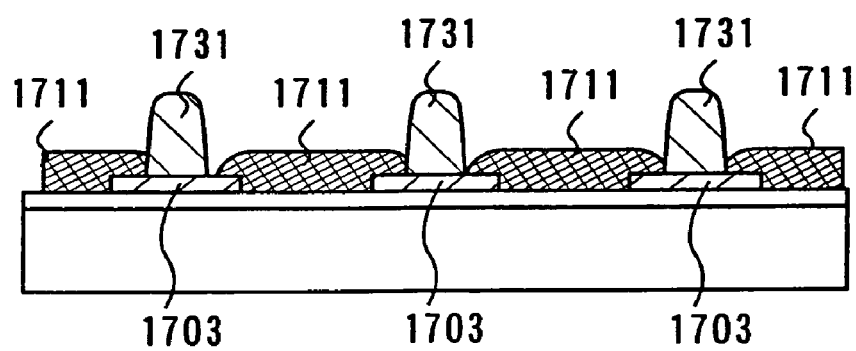
FIGS. 18A and 18B are cross-sectional views showing manufacturing steps of a semiconductor device according to the present invention.

Further, depending on the composition, viscosity, and surface tension of the solution, the second insulating film 1731 having a tapered cross-section can be formed as shown in FIG. 18.

Figure 17C:
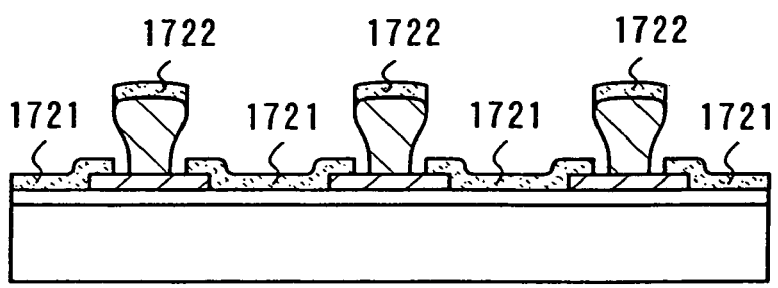

Next, as shown in FIG. 17C, the mask pattern 1711 is removed by $O_2$ ashing. Next, by depositing an organic EL material, an organic EL layer 1721 is formed over a portion between the adjacent first insulating films 1703. Through this step, an organic EL material 1722 is deposited also on the second insulating film 1712.

Figure 17D:
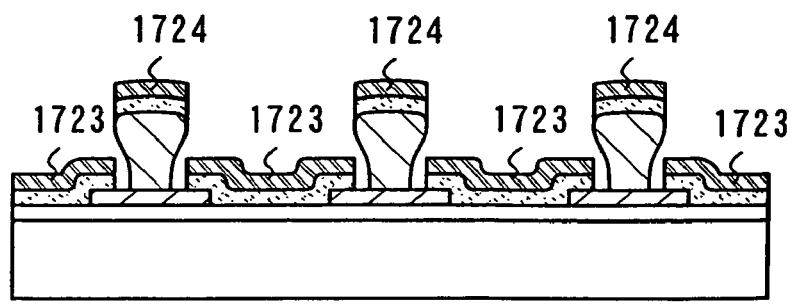

Next, as shown in FIG. 17D, a second pixel electrode 1723 is formed by depositing a conductive material. Through this step, a second conductive material 1724 is deposited on the organic EL material 1722 formed on the second insulating film 1712. In this embodiment, the second pixel electrode is formed of Al, Al—Li alloy, Ag—Mg alloy, or the like.

In the case where the second insulating film 1712 has a reverse tapered cross-section, the organic EL layer 1721 and the second pixel electrode 1723 are prevented from being deposited by a head of the second insulating film 1712. Therefore, they can be separated by the second insulating film 1712 without employing a known photolithography process.

Figure 18B:
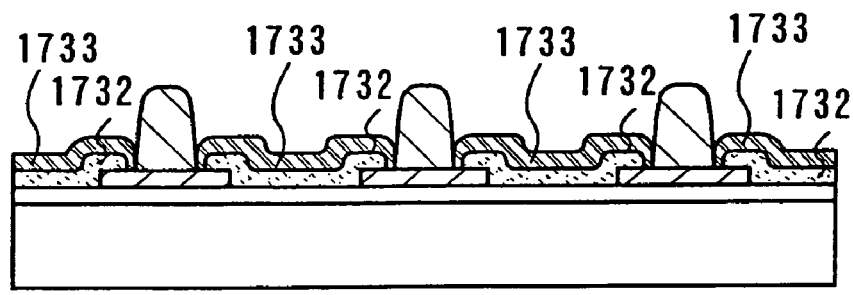

In the case where the second insulating film 1731 has a forward tapered cross-section, the organic EL material 1732 and the second pixel electrode 1733 can be formed by discharging solutions respectively containing an organic EL material and a conductive material to between each of the second insulating films 1731 by a droplet discharge method as shown in FIG. 18B.

After that, a protective film is deposited to manufacture an organic EL display panel.

Note that any of Embodiment Modes 1 to 5 can be applied to this embodiment. In this embodiment, a manufacturing method of an organic EL display panel is described, however, the invention is not limited to this and can be applied to other display devices such as a passive display device such as a liquid crystal display device, a DMD (Digital Micromirror Device), a PDP (Plasma Display Panel), an FED (Field Emission Display), and an electrophoresis display device (electronic paper).

In this embodiment, an insulating film for insulating an organic EL layer can be formed without using a known photolithography process.

Embodiment 7

In this embodiment, mounting of driver circuits (a signal driver circuit 1502 and scan driver circuits 1503a and 1503b) to a display panel described in the aforementioned embodiment is described with reference to FIGS. 19A to 19C.

Figure 19A:
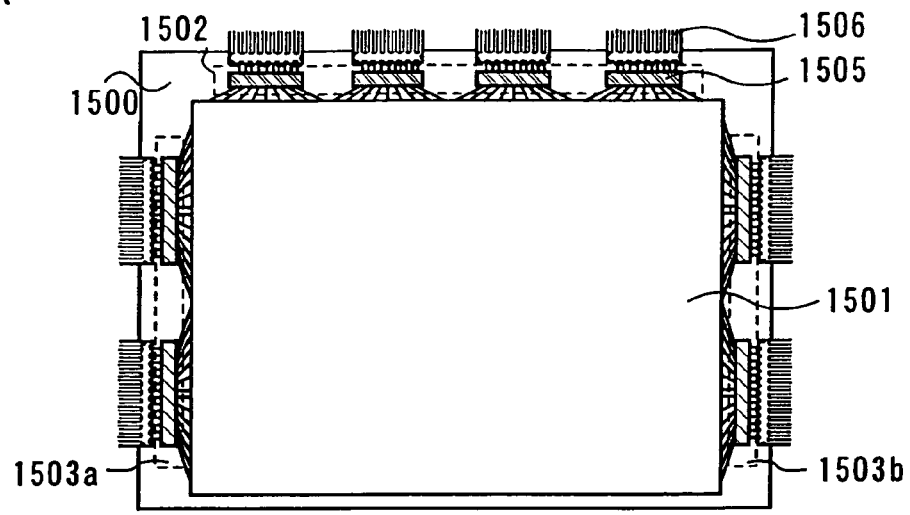
FIGS. 19A to 19C are top views showing a method for mounting a driver circuit of a display device according to the present invention.

As shown in FIG. 19A, the signal driver circuit 1502 and the scan driver circuits 1503a and 1503b are mounted on the periphery of the pixel area 1501. In FIG. 19A, IC chips 1505 are mounted on a substrate 1500 as the signal driver circuit 1502 and the scan driver circuits 1503a and 1503b, and the like. Then, the IC chips 1505 and an external circuit are connected through an FPC (Flexible Printed Circuit).

Figure 19B:
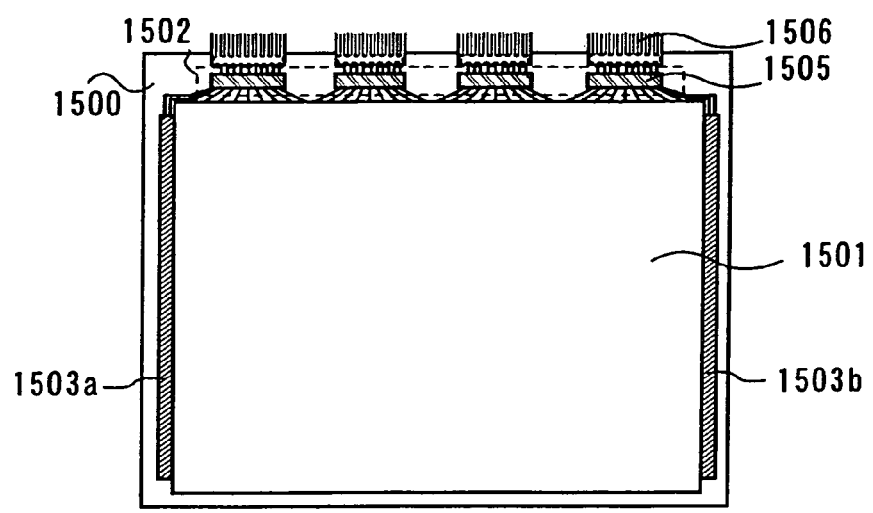

As shown in FIG. 19B, the pixel area 1501 and the scan driver circuits 1503a and 1503b and the like may be integrally formed on the substrate and the signal driver circuit 1502 and the like may be mounted as an IC chip independently in the case where TFTs are formed of an SAS or a crystalline semiconductor. In FIG. 19B, the IC chip 1505 is mounted on the substrate 1500 as the signal driver circuit 1502 by a COG method. The IC chip 1505 and an external circuit are connected through an FPC 1506.

Figure 19C:
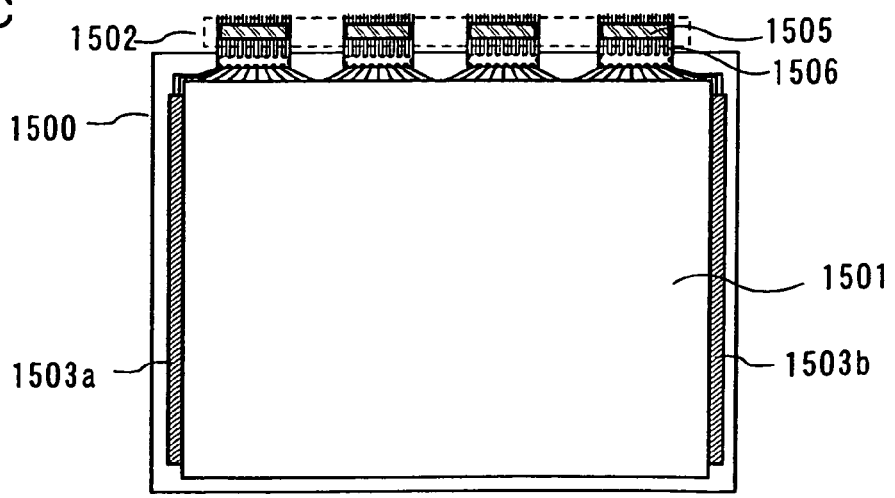

As shown in FIG. 19C, the signal driver circuit 1502 and the like are occasionally mounted by TAB instead of a COG method. The IC chip 1505 and an external circuit are connected through the FPC 1506. In FIG. 19C, the signal driver circuit is mounted by TAB; however, the scan driver circuit may be mounted by TAB.

By mounting the IC chip by TAB, a large pixel area can be provided relatively to the size of the substrate, and a narrower frame can be acquired.

The IC chip is formed with the use of a silicon wafer; however, an IC formed on a glass substrate (hereinafter referred to as a driver IC) may be provided instead of the IC chip. An IC chip is taken out of a circular silicon wafer; therefore, the shape of a mother substrate is restricted. On the other hand, the mother substrate of a driver IC is made of glass so that the shape is not restricted; thus, the productivity can be improved. The shape and the size of a driver IC can be freely set. In the case of forming a driver IC having a long side length of 15 mm to 80 mm, the required number of the IC chips can be reduced compare to the case of mounting IC chips. As a result, the number of the connection terminals can be reduced, so that the yield is improved.

A driver IC can be formed by using a crystalline semiconductor formed over a substrate, and the crystalline semiconductor can be formed by being irradiated with continuous wave laser light. A semiconductor film obtained by irradiation with the continuous wave laser light has crystal grains having large diameter with less crystal defects. As a result, a transistor having such a semiconductor film has good mobility and response speed which enables a high speed drive, and which is preferable for a driver IC.

Embodiment 8

In this embodiment, a mounting method of the driver circuits (the signal driver circuit 1502 and the scan driver circuits 1503a and 1503b) to a display panel described in the above embodiment will be described with reference to FIGS. 20A to 20D. The driver circuits may be mounted by a connection method using an anisotropic conductive material, wire bonding or the like, one of which will be described with reference to FIGS. 20A to 20D. In this embodiment, an example of using a driver IC for the signal driver circuit 1502 and the scan driver circuits 1503a and 1503b will be described. An IC chip can be used appropriately instead of the driver IC.

Figure 20A:
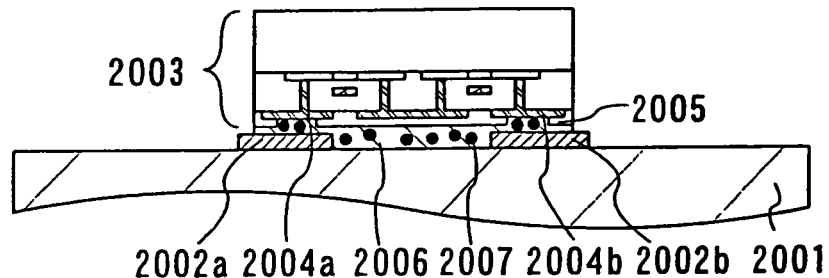
FIGS. 20A to 20D are cross-sectional views showing a method for mounting a driver circuit of a display device according to the present invention.

FIG. 20A shows an example of mounting a driver IC 2003 on an active matrix substrate 2001 using an anisotropic conductive material. Each of the source wiring, the gate wiring (not shown), and the like and electrode pads 2002a and 2002b that are extraction electrodes of the wirings are formed over the active matrix substrate 2001.

Connection terminals 2004a and 2004b are provided on the surface of the driver IC 2003, and a protective insulating film 2005 is formed on the periphery thereof.

The driver IC 2003 is fixed on the active matrix substrate 2001 with an anisotropic conductive adhesive 2006 and the connection terminals 2004a and 2004b, and the electrode pads 2002a and 2002b are electrically connected through conductive particles 2007 contained in the anisotropic conductive adhesive. The anisotropic conductive adhesive is an adhesive resin containing dispersed conductive particles (particle diameter of about 3 to 7 μm), which is, for example, epoxy resin, phenol resin, or the like. The conductive particles are formed of an element selected from gold, silver, copper, palladium, and platinum or alloy particles of a plurality of the elements. Alternatively, the particles having a multilayer structure of the elements may be used. Moreover, particles obtained by coating resin particles with an element selected from gold, silver, copper, palladium, and platinum or alloy particles of a plurality of the elements.

Instead of the anisotropic conductive adhesive, an anisotropic conductive film formed in film on the base film may be transferred to be used. Conductive particles similar to ones dispersed in the anisotropic conductive adhesive are also dispersed in the anisotropic conductive film. By using the conductive particles 2007 of suitable size and density mixed in the anisotropic conductive adhesive 2006, the driver IC can be mounted on the active matrix substrate in such a mode. This mounting method is suitable for mounting the driver ICs of FIGS. 19A and 19B.

Figure 20B:
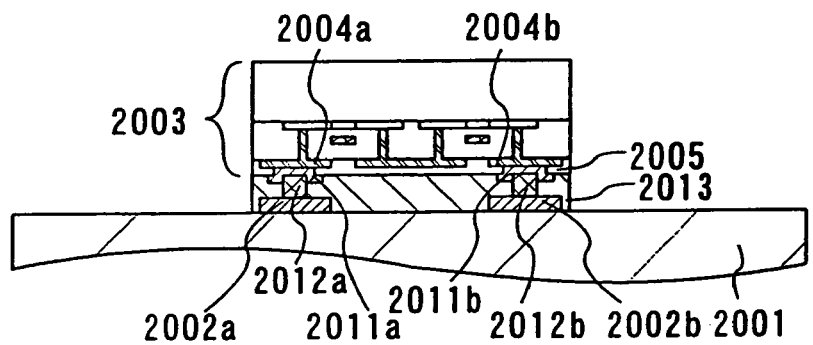

FIG. 20B shows an example of a mounting method using a contractile force of an organic resin, in which buffer layers 2011a and 2011b are formed of Ta, Ti and the like on the surface of the connection terminal of the driver IC, and Au is formed thereover to a thickness of about 20 μm by electroless plating or the like to form bumps 2012a and 2012b. A photo curing insulating resin 2013 is provided between the driver IC and the active matrix substrate; thus, a contractile force of the photo curing resin can be utilized to mount the electrodes welded by pressure. This mounting method is suitable for a mounting method of the driver ICs of FIGS. 19A and 19B.

Figure 20C:
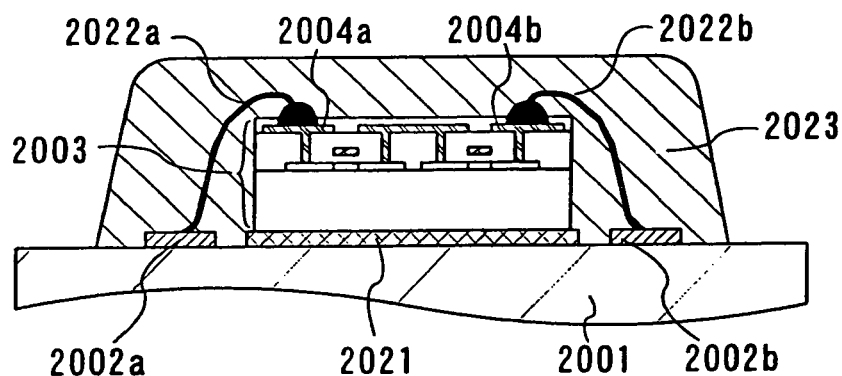

As shown in FIG. 20C, the driver IC 2003 may be fixed on the active matrix substrate 2001 with an adhesive 2021, and the connection terminal of the driver IC and the electrode pads 2002a and 2002b over the active matrix substrate 2001 may be connected through wirings 2022a and 2022b. Then, an organic resin 2023 is used for sealing. This mounting method is suitable for the mounting method of the driver ICs of FIGS. 19A and 19B.

Figure 20D:
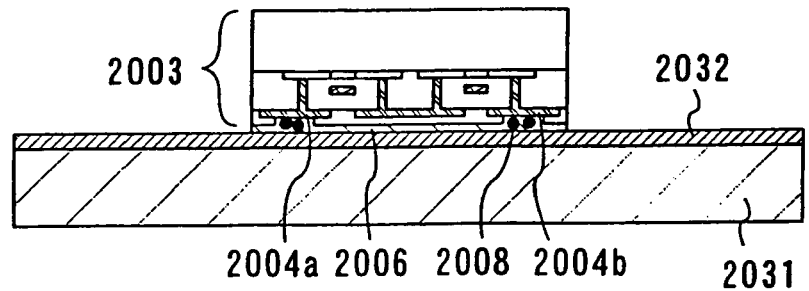

As shown in FIG. 20D, a wiring 2032 over an FPC (Flexible Printed Circuit) 2031 may be provided with the driver IC 2003 through the anisotropic conductive adhesive 2006 containing conductive particles 2008. This structure is very effective in the case of manufacturing an electronic device such as a portable terminal of which cassis is limited in size. This mounting method is suitable for the mounting method of the driver IC of FIG. 19C.

The mounting method of the driver IC is not particularly limited and a known method such as a COG method, wire bonding, TAB, or reflow processing using a solder bump can be employed. In the case of carrying out the reflow processing, it is preferable that a substrate used for a driver IC or an active matrix substrate is made of plastic which has high heat resistance, typically, a polyimide substrate, an HT substrate (Nippon Steel Chemical Group Co., Ltd.), and ARTON (JSR Corporation) formed of norbornene resin having a polarity group.

Embodiment 9

In this embodiment, a display module will be described. Here, a liquid crystal module will be described as an example of the display module with reference to FIG. 21.

Figure 21:
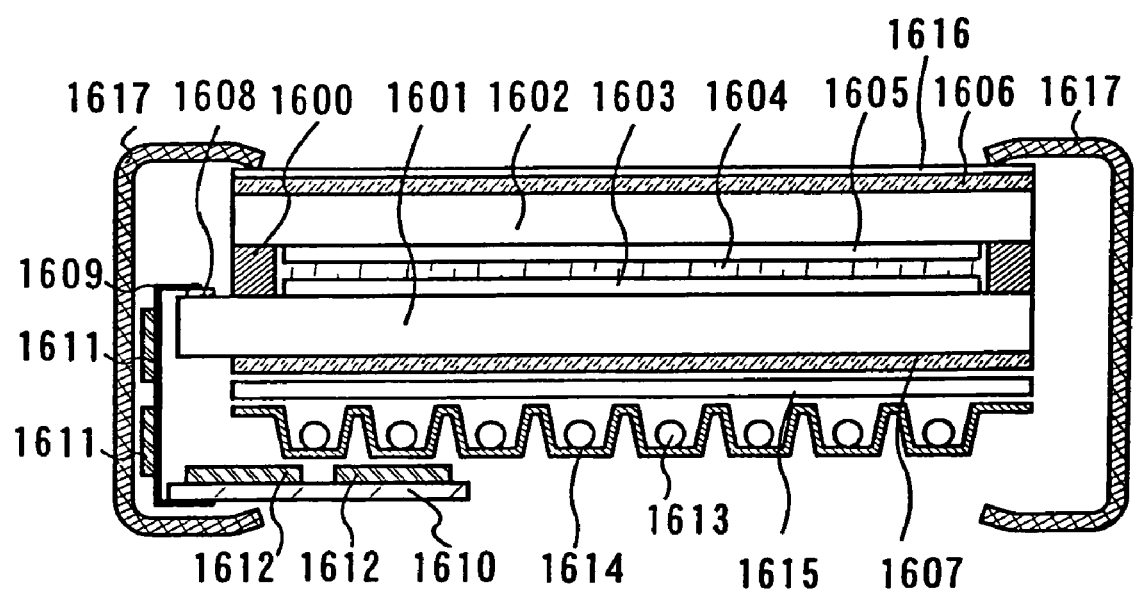
FIG. 21 is a figure showing a structure of a liquid crystal display module according to the present invention.

In the liquid crystal module shown in FIG. 21, an active matrix substrate 1601 and a counter substrate 1602 are fixed with a sealant 1600, with a pixel area 1603 and a liquid crystal layer 1604 interposed therebetween which form a display region.

A colored layer 1605 is required in the case of performing a color display. In the case of an RGB method, colored layers corresponding to red, green, and blue are provided on each pixel. Polarizers 1606 and 1607 are provided outside the active matrix substrate 1601 and the counter substrate 1602. A protective film 1616 is formed on the surface of the polarizer 1606 for alleviating external shocks.

The connection terminal 1608 provided on the active matrix substrate 1601 is connected to a wiring board 1610 through an FPC 1609. A pixel driver circuit (an IC chip, a driver IC and the like) 1611 is provided for the FPC and the connection wiring. The wiring board 1610 includes an external circuit 1612 such as a control circuit and a power supply circuit.

A cold cathode tube 1613, a reflector 1614, and an optical film 1615 are parts of a backlight unit as a light source which projects light onto a liquid crystal display panel. The liquid crystal panel, the light source, the wiring board, the FPC, and the like are held and protected by a bezel 1617.

Embodiment 10

In this embodiment, the exterior of a light emitting display module will be described with reference to FIGS. 22A and 22B as an example of a display module.

FIG. 22A is a top plan view of a panel formed of a first substrate and a second substrate sealed with a first sealant 1205 and a second sealant 1206. FIG. 22B is a sectional view taken along line A-A' in FIG. 22A.

In FIG. 22A, reference numeral 1201 shown by a dotted line denotes a signal (source line) driver circuit, 1202 denotes a pixel area, and 1203 denotes a scan (gate line) driver circuit. In this embodiment, a signal driver circuit 1201, a pixel area 1202, and a scan driver circuit 1203 are in a region which is sealed by the first sealant and the second sealant. It is preferable to use epoxy resin having high viscosity which contains fillers as the first sealant. It is preferable to use epoxy resin having low viscosity as the second sealant. It is also preferable that the first sealant 1205 and the second sealant 1206 do not transmit moisture or oxygen as much as possible.

Further, a drying agent may be provided between the pixel area 1202 and the sealant 1205. In the pixel area, a drying agent may be provided on the scan line or the signal line. As the drying agent, it is preferable to use a substance which absorbs moisture ($H_2O$) by chemical absorption such as oxide of alkaline earth metal such as calcium oxide (CaO) and barium oxide (BaO). However, a substance which absorbs moisture by physical absorption such as zeolite or silica gel may be used as well.

In addition, the first substrate can be fixed on the second substrate 1204 with the resin having high moisture permeability containing particles of drying agent. Here, as the resin having high moisture permeability, for example, an acrylic resin such as ester acrylate, ether acrylate, ester urethane acrylate, ether urethane acrylate, butadiene urethane acrylate, special urethane acrylate, epoxy acrylate, amino resin acrylate, and acrylic acrylate can be used. Besides, epoxy resin such as bisphenol A vliquid epoxy resin, bisphenol A solid epoxy resin, epoxy resin containing bromine, bisphenol F type resin, bisphenol AD type resin, phenol resin, cresol resin, novolac type resin, cycloaliphatic ring epoxy resin, Epi-Bis type epoxy resin, glycidyl ester resin, glycidyl amine resin, heterocyclic epoxy resin, and modified epoxy resin can be used. Other substances may be used as well. An inorganic substance such as a siloxane polymer, polyimide, PSG (Phosphor Silicate Glass), and BPSG (Boron Phosphorous Silicon Glass) may be used.

A drying agent is provided in a region overlapped with the scan line, and a resin having high moisture permeability which contains particles of the drying agent is fixed on the second substrate. Thus, entrance of moisture into a display element and deterioration caused thereby can be suppressed, without decreasing the aperture ratio.

Reference numeral 1210 denotes a connection region for transmitting a signal inputted to the signal driver circuit 1201 and the scan driver circuit 1203, which receives a video signal and a clock signal from an FPC (Flexible Printed Circuit) 1209 as an external input terminal through a connection wiring 1208.

Next, a sectional structure will be described with reference to FIG. 22B. A driver circuit and a pixel area are formed over a first substrate 1200, which have a plurality of semiconductor elements such as TFTs. The signal driver circuit 1201 as the driver circuit and the pixel area 1202 are shown. Note that the signal driver circuit 1201 comprises a CMOS circuit formed of a combination of an n-channel TFT 1221 and a p-channel TFT 1222.

In this embodiment, TFTs of a signal driver circuit, a scan driver circuit, and a pixel area are formed over the same substrate. Accordingly, the volume of a light emitting display device can be reduced.

The pixel area 1202 is formed of a plurality of pixels including a switching TFT 1211, a driving TFT 1212, and a first pixel electrode (anode) 1213 formed of a reflective conductive film electrically connected to a drain of the driving TFT 1212.

An interlayer insulating film 1220 for each of the TFTs 1211, 1212, 1221, and 1222 can be formed by using a material mainly containing an inorganic material (silicon oxide, silicon nitride, silicon oxynitride, and the like), and an organic material (polyimide, polyamide, polyimide amide, benzocyclobutene, or siloxane polymer. By using a siloxane polymer as a source material of the interlayer insulating film, an insulating film having a structure containing silicon and oxygen as a backbone structure, and hydrogen and/or an alkyl group as a side chain can be obtained.

Further, an insulator (referred to as a bank, a partition, a barrier, and the like) 1214 is formed at both ends of the first pixel electrode (anode) 1213. In order to obtain a film for the insulator 1214 with good coverage, the insulator 1214 is formed so that its top portion and the bottom portion have curved surfaces. The insulator 1214 can be formed of a material containing an inorganic material (silicon oxide, silicon nitride, silicon oxynitride, silicon nitroxide, and the like) or an organic material (polyimide, polyamide, polyimide amide, benzocyclobutene, or siloxane polymer) as a main component. When a siloxane polymer is sued as a source material for the insulator, an insulating film having silicon and oxygen as a backbone structure and hydrogen and/or alkyl group as a side chain can be obtained. Further, the insulator 1214 may be covered with an aluminum nitride film, an aluminum nitride oxide film, a thin film containing carbon as a main component, or a protective film (planarization layer) formed of a silicon nitride film. By using an organic material in which a material which absorbs visible light, such as a black pigment and dye is dissolved or dispersed, stray light from a light emitting element to be formed later can be absorbed. As a result, contrast of each pixel is improved. Further, by forming the interlayer insulating film 1220 of an insulator which shields light, a light shielding effect can be obtained by combination with the insulator 1214.

A layer 1215 containing a light emitting substance is selectively formed on the first pixel electrode (anode) 1213 by depositing an organic compound material.

The layer 1215 containing a light emitting substance can have a known structure appropriately. Here, a structure of the layer 1215 containing a light emitting substance will be described with reference to FIGS. 23A to 23F.

Figure 23A:
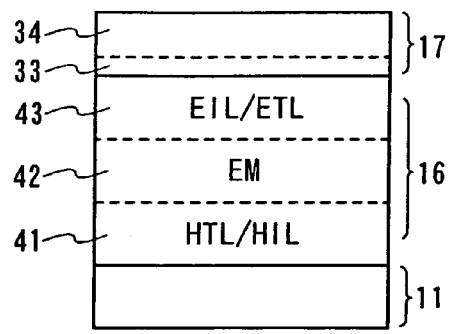
FIGS. 23A to 23F are figures showing modes of a light emitting element which are adaptable to the present invention.

FIG. 23A shows an example of forming a first pixel electrode 11 using a light-transmitting conductive oxide material which contains 1 to 15 atomic % of silicon oxide. A layer 16 containing a light emitting substance in which a hole injection layer or a hole transporting layer 41, a light emitting layer 42, an electron transport layer or an electron injection layer 43 are stacked is provided thereon. A second pixel electrode 17 is formed of a first electrode layer 33 containing an alkali metal or an alkaline earth metal such as LiF or MgAg, and a second electrode layer 34 formed of a metal material such as aluminum. A pixel having this structure can emit light from the first pixel electrode 11 side as shown by an arrow in the figure.

Figure 23B:
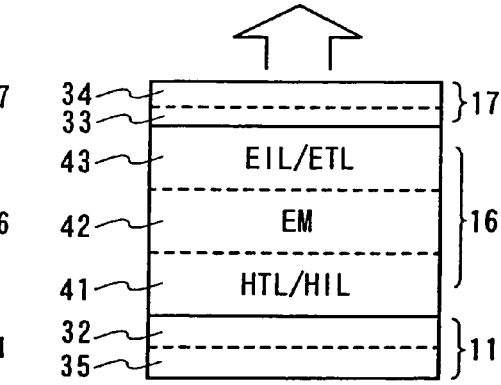

FIG. 23B shows an example of emitting light from the second pixel electrode 17. The first pixel electrode 11 is formed of a first electrode layer 35 formed of a metal such as aluminum or titanium, or a metal material containing the aforementioned metal and nitrogen at a concentration equal to or less than the stoichiometric composition ratio, and a second electrode layer 32 formed of a conductive oxide material containing silicon oxide at a concentration of 1 to 15 atomic %. The layer 16 containing a light emitting substance in which the hole injection layer or the hole transporting layer 41, the light emitting layer 42, the electron transport layer or the electron injection layer 43 are stacked is provided thereon. The second pixel electrode 17 is formed of a third electrode layer 33 containing an alkali metal or an alkaline earth metal such as LiF or CaF and a fourth electrode layer 34 formed of a metal material such as aluminum. Each layer is formed to a thickness of 100 m or less to transmit light, so that light can be emitted from the second pixel electrode 17.

Figure 23C:
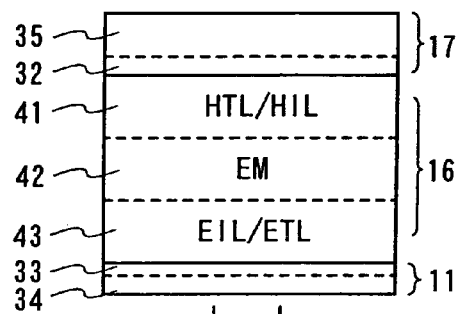
Figure 23D:
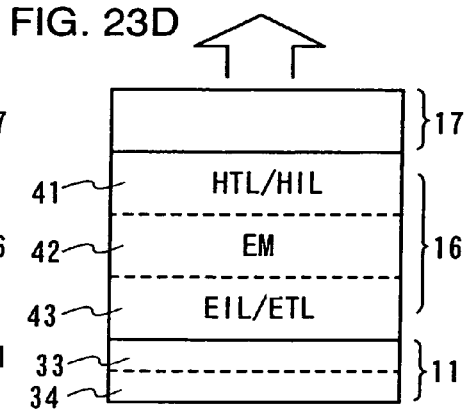
Figure 23E:
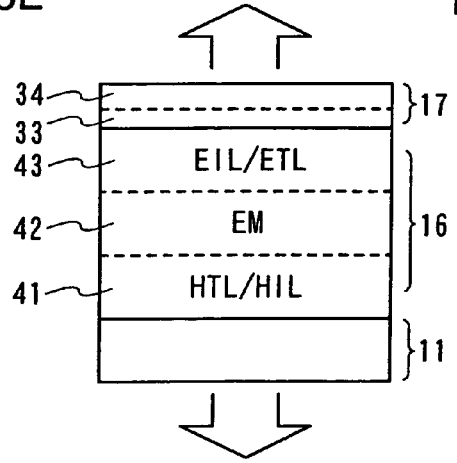

FIG. 23E shows an example of emitting light in both directions, that is from the first electrode and the second electrode. A light-transmitting conductive film which has high work function is used for the first pixel electrode 11 while a light-transmitting conductive film which has low work function is used for the second pixel electrode 17. Representatively, the first pixel electrode 11 is formed of a conductive oxide material containing silicon oxide at a concentration of 1 to 15 atomic % and the second pixel electrode 17 is respectively formed of the third electrode layer 33 containing an alkali metal or an alkaline earth metal such as LiF or CaF, and the fourth electrode layer 34 formed of a metal material such as aluminum with a thickness of 100 nm or less.

FIG. 23C shows an example of emitting light from the first pixel electrode 11, where a layer containing a light emitting substance includes a stack in the order of an electron transport layer or the electron injection layer 43, the light emitting layer 42, the hole injection layer or the hole transporting layer 41. The second pixel electrode 17 is formed of the second electrode layer 32 formed of a conductive oxide material containing silicon oxide at a concentration of 1 to 15 atomic % and the first electrode layer 35 formed of metal such as aluminum and titanium or a metal material containing the aforementioned metal and nitrogen at a concentration equal to or less than the stoichiometric composition ratio in order from the layer 16 containing a light emitting substance. The first pixel electrode 11 is formed of the third electrode layer 33 containing an alkali metal or an alkaline earth metal such as LiF and CaF and the fourth electrode layer 34 formed of a metal material such as aluminum. Each layer is formed to a thickness of 100 m or less to transmit light, so that light can be emitted from the second pixel electrode 11.

FIG. 23D shows an example of emitting light from the second pixel electrode 17, where a layer containing light emitting substance includes a stack in the order of the electron transport layer or the electron injection layer 43, the light emitting layer 42, the hole injection layer or the hole transporting layer 41. The first pixel electrode 11 has a similar structure to the second pixel electrode in FIG. 23C and is formed to an enough thickness to reflect light emitted from the layer containing light emitting substances. The second pixel electrode 17 is formed of a conductive oxide material containing silicon oxide at a concentration of 1 to 15 atomic %. By forming the hole injection layer or the hole transporting layer 41 using a metal oxide as an inorganic substance (representatively molybdenum oxide or vanadium oxide) in the structure, the hole injection property is improved by oxygen introduced in forming the second electrode layer 32 is supplied; thus, the drive voltage can be decreased.

Figure 23F:
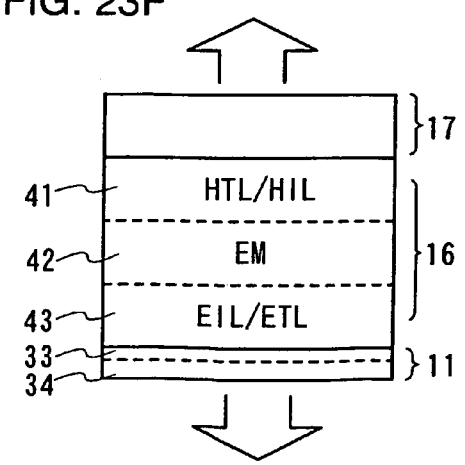

FIG. 23F shows an example of emitting light in both directions, that is from the first pixel electrode and the second pixel electrode. A light-transmitting conductive film which has low work function is used for the first pixel electrode 11 and a light-transmitting conductive film which has high work function is used for the second pixel electrode 17. Representatively, the first pixel electrode 11 is formed of the third electrode layer 33 containing an alkali metal or an alkaline earth metal such as LiF or CaF, and the fourth electrode layer 34 formed of a metal material such as aluminum, and the second pixel electrode 17 is formed of a conductive oxide material containing silicon oxide at a concentration of 1 to 15 atomic %.

In this manner, a light emitting element 1217 formed of the first pixel electrode (anode) 1213, the layer 1215 containing light emitting substances, and the second pixel electrode (cathode) 1216 is formed as shown in FIG. 22B. The light emitting element 1217 emits light to the second substrate 1204 side.

A protective laminate 1218 is formed to seal the light emitting element 1217. The protective laminate 1218 is formed with a laminate of a first inorganic insulating film, a stress relief film, and a second inorganic insulating film. Next, the protective laminate 1218 and the second substrate 1204 are attached together with a first sealant 1205 and a second sealant 1206. Note that it is preferable that the second sealant be dropped by using an apparatus for dropping the sealant like an apparatus for dropping liquid crystals. After a sealant is dropped or discharged onto an active matrix substrate from a dispenser, the second substrate and the active matrix substrate are attached together and can be sealed by ultraviolet curing.

A polarizer 1225 is fixed onto the surface of the second substrate 1204, and a half or quarter wave plate 1229 and an anti-reflection film 1226 are provided on the surface of the polarizer 1225. A quarter wave plate, a half wave plate 1229, and a polarizer 1225 may be provided in order from the second substrate 1204. External light can be prevented from reflecting off the pixel electrode by providing a wave plate and a polarizer. If the first pixel electrode 1213 and the second pixel electrode 1216 are each formed with a transparent or translucent conductive film, and the interlayer insulating film 1220 is formed of a material which absorbs visible light or an organic material in which a material which absorbs visible light is dissolved or dispersed.

The connection wiring 1208 and the FPC 1209 are electrically connected to each other through an anisotropic conductive film or anisotropic conductive resin 1227. Further, it is preferable to seal a connecting portion between each wiring layer and a connection terminal with a sealing resin. With this structure, the light emitting element can be prevented from being deteriorated by moisture entered from a section.

A space filled with inert gas, for example, nitrogen gas may be provided between the second substrate 1204 and the protective laminate 1218. Thus, moisture and oxygen can be further prevented.

A color layer can be provided between the pixel area 1202 and the polarizer 1225. In this case, by providing a light emitting element which can emit white light in a pixel area and a colored layer expressing RGB, full color display can be performed. Further, by providing a light emitting element which can emit blue color in the pixel area and providing a color conversion layer and the like separately, full color display can be performed. Moreover, light emitting elements which emit red, green, and blue light can be formed in each pixel area and also a colored layer can be used as well. Such a display module can perform high resolution display with high color purity.

A light emitting display module can be formed using a substrate formed of a film, resin, or the like for one or both of the first substrate 1200 and the second substrate 1204. By sealing without using a counter substrate in this manner, more lightweight, compact, and thin display device can be acquired.

Note that any one of Embodiment Modes 1 to 5 can be applied to this embodiment. In this embodiment, a light emitting display module has been described as a display module; however, the invention is not limited thereto and can be applied to display modules such as a light emitting display device, a DMD (Digital Micromirror Device), a PDP (Plasma Display Panel), an FED (Field Emission Display), and an electrophoresis display device (electronic paper).

Embodiment 11

By providing a display module described in the above embodiments into a housing, various electronic devices can be manufactured. The electronic devices include a television apparatus, a video camera, a digital camera, a goggle type display (a head mounted display), a navigation system, an audio reproduction device (a car audio system, an audio component set, and the like), a notebook personal computer, a game machine, a portable information terminal (a mobile computer, a cellular phone, a portable game machine, an electronic book, or the like), an image reproducing apparatus provided with a memory medium (specifically a device provided with a display which reproduces a memory medium such as a Digital Versatile Disc (DVD) and can display the reproduced image), and the like. Here, as typical examples of the electronic devices, FIGS. 24 and 25 show a television apparatus and block diagram thereof, and FIGS. 19A and 19B show a digital camera.

Figure 24:
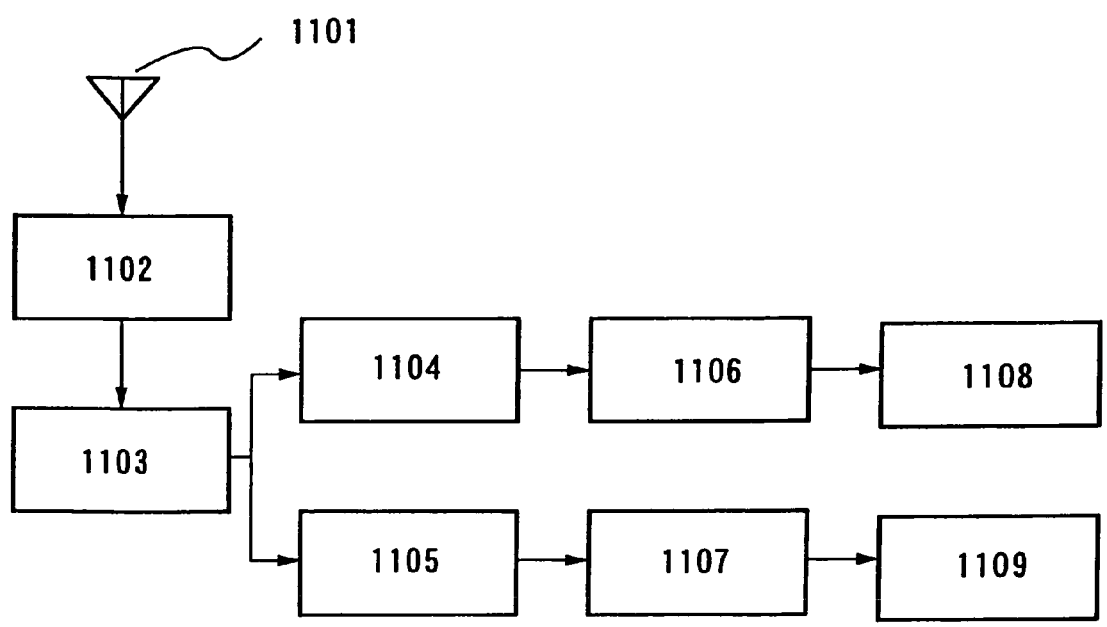
FIG. 24 is a block diagram showing a structure of an electronic device.
Figure 25:
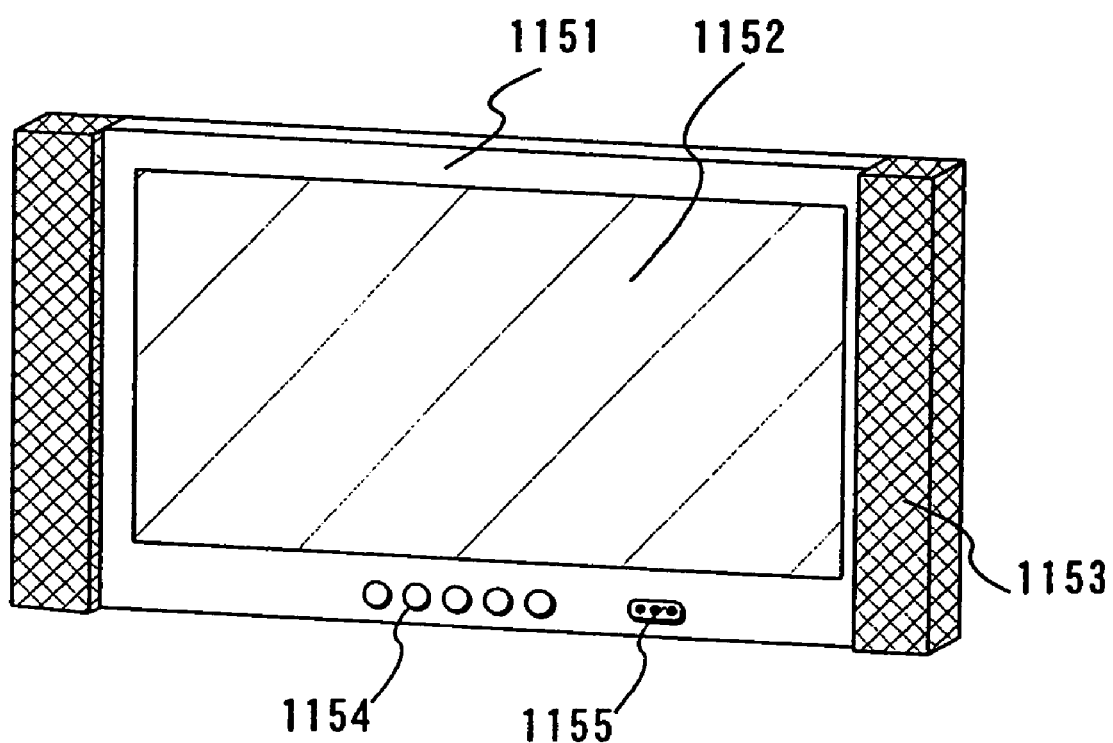
FIG. 25 is a figure showing an example of an electronic device.

FIG. 24 shows a typical structure of a television apparatus which receives an analog television broadcast. In FIG. 24, an electric wave for television broadcast received by an antenna 1101 is inputted to a tuner 1102. The tuner 1102 generates and outputs an intermediate frequency (IF) signal by mixing a high frequency television signal inputted from the antenna 1101 with a signal of local oscillation frequency controlled in accordance with a desired receive frequency.

The IF signal taken out from the tuner 1102 is amplified to a required voltage by an intermediate frequency amplifier (an IF amplifier) 1103, and then video detection is performed by a video detection circuit 1104 as well as a sound detection is performed by a sound detection circuit 1105. The video signal outputted from the video detection circuit 1104 is separated into a luminance signal and a color signal by a video signal processing circuit 1106 and further becomes a video signal through a predetermined video signal processing, and then outputted to a video output portion 1108 of a liquid crystal display device, a light emitting display device, a DMD (Digital Micromirror Device), a PDP (Plasma Display Panel), an FED (Field Emission Display), an electrophoresis display device (electronic paper), or the like as one of semiconductor devices of the invention.

Further, the signal outputted from the sound detection circuit 1105 becomes a sound signal through a process such as FM demodulation by the sound processing circuit 1107, then appropriately amplified, and outputted to a sound output portion 1109 such as a speaker.

A television apparatus using the invention is not limited to the application to an analog broadcast such as a ground-based broadcast such as VHF/UHF band broadcast, a cable broadcast, or a BS broadcast, and can be applied to a digital terrestrial broadcast, a cable digital broadcast, or a BS digital broadcast.

FIG. 25 shows a perspective view of a television apparatus seen from a front side, including a housing 1151, a display portion 1152, a speaker portion 1153, an operating portion 1154, a video input terminal 1155, and the like. FIG. 24 shows a structure thereof.

The display portion 1152 is an example of the video output portion 1108 in FIG. 24, which displays an image.

The speaker portion 1153 is an example of the sound output portion in FIG. 24, which outputs sound.

The operating portion 1154 is provided with a power source switch, a volume switch, a button selector, a tuner switch, a selection button, and the like. By pressing the buttons, ON/OFF of the power source, selection of images, control of sound, selection of a tuner, and the like are operated. Although not shown, the aforementioned selection can also be performed by a remote controller type operating portion.

The video input terminal 1155 is a terminal for inputting a video signal from an external device such as a VTR, a DVD, a game machine, or the like into the television apparatus.

In the case where the television apparatus described in this embodiment is a wall-mounted television apparatus, a portion for hanging it on wall is provided on the back of the main body.

By using a display device that is an example of a semiconductor device of the invention for a display portion of a television apparatus, the television apparatus can be manufactured with high throughput and yield at low cost. Further, by applying a semiconductor device of the invention to a CPU which controls the video detection circuit, the video processing circuit, the sound detection circuit, and the sound processing circuit of the television apparatus, the television apparatus can be manufactured with high throughput and yield at low cost. Accordingly, the invention can be particularly applied to a large display medium such as a wall-mounted television apparatus, an information display board at train stations, airports, and the like, an advertisement display board on the streets and the like.

Figure 26A:
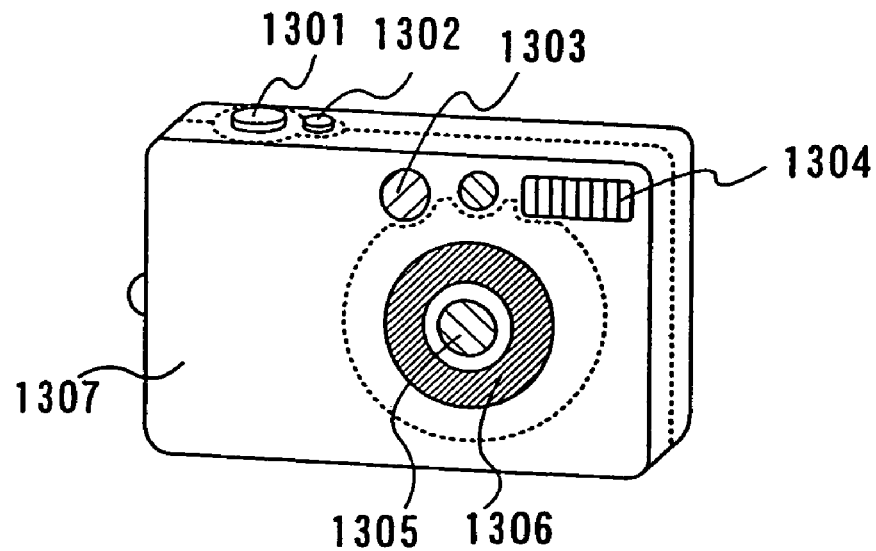
FIGS. 26A and 26B are figures showing an example of an electronic device.
Figure 26B:
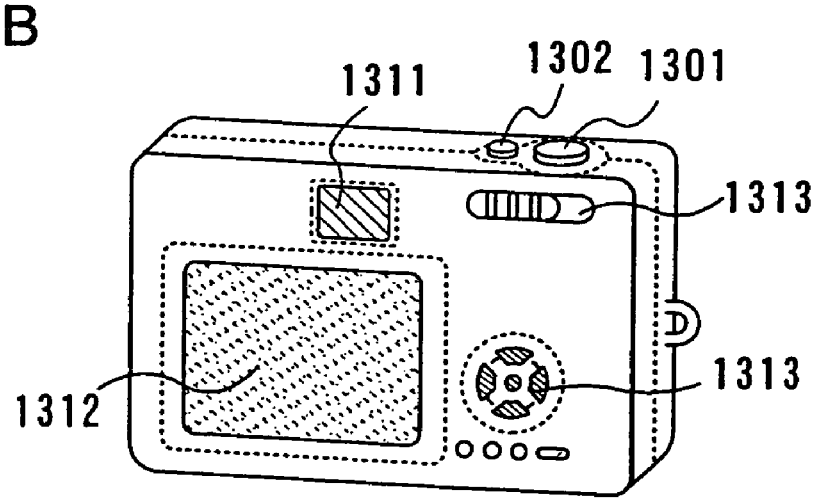

FIGS. 26A and 26B show examples of a digital camera. FIG. 26A is a perspective view of the digital camera seen from the front while FIG. 26B is a perspective view thereof seen from the back. In FIG. 26A, the digital camera includes a release button 1301, a main switch 1302, a finder 1303, a flash 1304, a lens 1305, a barrel 1306, and a housing 1307.

In FIG. 26B, a finder eyepiece window 1311, a monitor 1312, and an operation button 1313 are provided.

When the release button 1301 is pressed halfway down, a focus adjustment system and an exposure control system are operated, and a shutter opens when the release button 1301 is pressed completely down.

The main switch 1302 is pressed or turned, so that ON/OFF of the power of the digital camera is switched.

The finder 1303 is disposed above the lens 1305 on the front of the digital camera, which is used for checking a shooting range and a focus position from the finder eyepiece window 1311 shown in FIG. 26B.

The flash 1304 is disposed at an upper front portion of the digital camera, which emits fill light as the shutter opens with the release button pressed if the subject brightness is low.

The lens 1305 is disposed in front of the digital camera. The lens includes a focusing lens, a zoom lens and forms an imaging optical system as well as the shutter and an aperture which are not shown. Moreover, an imaging device such as a CCD (Charge Coupled Device) is provided in the back of the lens.

The barrel 1306 is for moving the lens for focusing the focusing lens, the zoom lens, and the like. In shooting an image, the lens 1305 is moved forward by sliding out the barrel. When carried, the lens 1305 is collapsed for compactness. In this embodiment, an subject can be shot by zooming by sliding out the barrel; however, the invention is not limited to this structure and a digital camera may have a structure which is capable of shooting an image by zooming without sliding out the barrel due to the structure of the imaging optical system in the housing 1307.

The finder eyepiece window 1311 is provided on an upper back portion of the digital camera, which is used for checking a shooting range and a focus position.

The operation button 1313 includes various function buttons provided on the back of the digital camera, and further includes a set-up button, a menu button, a display button, a function button, a selection button, and the like.

By using a display device which is a mode of a semiconductor device of the invention for a monitor, a low cost digital camera can be manufactured with high throughput and yield at low cost. In addition, a CPU which is a mode of a semiconductor device of the invention for a CPU which performs processes according to input using the various function buttons, the main switch, the release button, and the like, a CPU which controls each of a circuit which performs an auto focusing operation and an auto focus adjustment operation, a timing circuit which controls driving of stroboscopic light and CCD (Charge Coupled Device), an imaging circuit which generates a video signal from a signal photoelectrically converted by an imaging device such as a CCD, an A/D converter circuit which converts a video signal generated in the imaging circuit into a digital signal, a memory interface which writes and reads video data in a memory, is used. Thus, digital camera can be manufactured with high throughput and high yield at low cost.

This application is based on Japanese Patent Applications serial No. 2004-241805 filed in Japan Patent Office on Aug. 23, 2004, the contents of which are hereby incorporated by reference.

What is claimed is:

1. A method for manufacturing a semiconductor device, comprising the steps of:
    forming a first film over a substrate on a surface, wherein a wettability of the first film is lower than the surface;
    applying a solution containing a mask material to the first film thereby forming a mask over the first film by using an ink-jet method;
    etching selectively the first film with the use of the mask thereby forming at least two low wettability regions and a high wettability region over the surface, wherein the high wettability region is provided between the two low wettability regions;
    removing the mask;
    applying a solution containing a conductive material of a gate electrode selectively over the surface to form the gate electrode by using the ink-jet method after removing the mask, and
    forming a gate insulating film over the gate electrode,
    wherein a top surface of the high wettability region is lower than top surfaces of the two low wettability regions.

2. The method for manufacturing a semiconductor device according to claim 1, wherein the material is included in an insulating film, a semiconductor film, or a conductive film.

3. The method for manufacturing a semiconductor device according to claim 1, wherein the solution containing the mask material contains a surfactant.

4. The method for manufacturing a semiconductor device according to claim 1, wherein contact angle of the solution containing the material in the low wettability region is larger than contact angle of the solution containing the material in the high wettability region.

5. The method for manufacturing a semiconductor device according to claim 4, wherein difference between contact angles in the low wettability region and the high wettability region is 30° or more.

6. The method for manufacturing a semiconductor device according to claim 1, wherein the first film includes a compound containing a fluorocarbon chain.

7. The method for manufacturing a semiconductor device according to claim 1, wherein the solution containing the mask material is discharged while heating the surface.

8. The method for manufacturing a semiconductor device according to claim 1, wherein the ink-jet method is conducted under a reduced pressure.

9. The method for manufacturing a semiconductor device according to claim 1, wherein the conductive material includes conductor particles, and diameters of the particles are less than 0.1 µm.

10. A method for manufacturing a semiconductor device, comprising the steps of:
    forming a first film over a substrate on a surface, wherein a wettability of the first film is lower than the surface;
    applying a solution containing a mask material to the first film thereby forming a mask over the first film by using an ink-jet method;

etching selectively the first film with the use of the mask thereby forming at least two low wettability regions and a high wettability region over the surface, wherein the high wettability region is provided between the two low wettability regions;

removing the mask;

applying a solution containing a conductive material of a gate electrode selectively over the surface to form the gate electrode by using the ink-jet method after removing the mask, and forming a gate insulating film over the gate electrode, wherein contact angle of the solution containing the mask material on the first film is smaller than contact angle of the solution containing the material on the first film, wherein a top surface of the high wettability region is lower than top surfaces of the two low wettability regions.

11. The method for manufacturing a semiconductor device according to claim 10, wherein the material is included in an insulating film, a semiconductor film, or a conductive film.

12. The method for manufacturing a semiconductor device according to claim 10, wherein the solution containing the mask material contains a surfactant.

13. The method for manufacturing a semiconductor device according to claim 10, wherein contact angle of the solution containing the material in the low wettability region is larger than contact angle of the solution containing the material in the high wettability region.

14. The method for manufacturing a semiconductor device according to claim 13, wherein difference between contact angles in the low wettability region and the high wettability region is 30° or more.

15. The method for manufacturing a semiconductor device according to claim 10, wherein the first film includes a compound containing a fluorocarbon chain.

16. The method for manufacturing a semiconductor device according to claim 10, wherein the solution containing the mask material is discharged while heating the surface.

17. The method for manufacturing a semiconductor device according to claim 10, wherein the ink-jet method is conducted under a reduced pressure.

18. The method for manufacturing a semiconductor device according to claim 10, wherein the conductive material includes conductor particles, and diameters of the particles are less than 0.1 μm.

19. A method for manufacturing a semiconductor device, comprising the steps of:

applying a solution containing a conductive material of a gate electrode over a substrate to form the gate electrode selectively by using an ink-jet method;

forming a gate insulating film over the gate electrode;

forming a first semiconductor film over the gate insulating film;

forming a second semiconductor film having one conductivity over the first semiconductor film;

forming a patterned first film over the second semiconductor film by selective etching, wherein a wettability of the patterned first film is lower than the second semiconductor film, to form at least two low wettability regions and a high wettability region over the second semiconductor film;

applying a solution containing a mask material selectively over the second semiconductor film to form a mask over the second semiconductor film by using the ink-jet method;

etching the patterned first film, the first semiconductor film and the second semiconductor film with the use of the mask, and forming a source and a drain electrode over the second semiconductor film, wherein the high wettability region is provided between the two low wettability regions, and wherein a top surface of the high wettability region is lower than top surfaces of the two low wettability regions.

20. The method for manufacturing a semiconductor device according to claim 19, wherein contact angle of the solution containing the mask material in the low wettability region is larger than contact angle of the solution containing the mask material in the high wettability region.

21. The method for manufacturing a semiconductor device according to claim 20, wherein difference between contact angles in the low wettability region and high wettability region is 30° or more.

22. The method for manufacturing a semiconductor device according to claim 19, wherein the patterned first film includes a compound containing a fluorocarbon chain.

23. The method for manufacturing a semiconductor device according to claim 19, wherein the ink-jet method is conducted under a reduced pressure.

24. The method for manufacturing a semiconductor device according to claim 19, wherein the conductive material includes conductor particles, and diameters of the particles are less than 0.1 μm.

* * * * *